(12) United States Patent
Takabayashi

(10) Patent No.: US 8,710,614 B2
(45) Date of Patent: Apr. 29, 2014

(54) LIGHT RECEIVING ELEMENT WITH OFFSET ABSORBING LAYER

(75) Inventor: Kazumasa Takabayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/402,114

(22) Filed: Feb. 22, 2012

(65) Prior Publication Data

US 2012/0235265 A1 Sep. 20, 2012

(30) Foreign Application Priority Data

Mar. 20, 2011 (JP) ................................ 2011-061842

(51) Int. Cl.
*H01L 31/00* (2006.01)
*H01L 27/14* (2006.01)

(52) U.S. Cl.
USPC ............... 257/466; 257/431; 257/E33.001; 257/E33.002

(58) Field of Classification Search
USPC ............... 257/431, 466, E33.001, E33.002
See application file for complete search history.

(56) References Cited

U.S. PATENT DOCUMENTS

| | | | | |
|---|---|---|---|---|
| 4,950,044 A * | 8/1990 | Makita | ................ | 385/24 |
| 5,134,671 A * | 7/1992 | Koren et al. | ................ | 385/14 |
| 5,300,789 A * | 4/1994 | Gorfinkel et al. | ................ | 257/21 |
| 5,394,005 A * | 2/1995 | Brown et al. | ................ | 257/461 |
| 5,574,742 A * | 11/1996 | Ben-Michael et al. | .... | 372/45.01 |
| 5,665,985 A * | 9/1997 | Iwata | ................ | 257/95 |
| 5,727,096 A * | 3/1998 | Ghirardi et al. | ................ | 385/14 |
| 5,991,322 A * | 11/1999 | Takiguchi et al. | ........ | 372/50.11 |
| 6,194,771 B1 * | 2/2001 | Kato et al. | ................ | 257/436 |
| 6,236,097 B1 * | 5/2001 | Hassard et al. | ................ | 257/459 |
| 6,323,530 B1 * | 11/2001 | Kubota | ................ | 257/466 |
| 6,373,134 B1 * | 4/2002 | Watanabe | ................ | 257/734 |
| 6,542,525 B1 * | 4/2003 | Matsumoto et al. | ............ | 372/26 |
| 6,771,682 B2 * | 8/2004 | Peters | ................ | 372/50.1 |
| 6,943,422 B2 * | 9/2005 | Yasuoka et al. | ................ | 257/432 |
| 7,005,680 B2 * | 2/2006 | Otsuka et al. | ................ | 257/91 |
| 7,324,258 B2 * | 1/2008 | Kwon et al. | ................ | 359/248 |
| 7,359,588 B2 * | 4/2008 | Kang et al. | ................ | 385/14 |
| 7,415,185 B2 * | 8/2008 | Nakaji et al. | ................ | 385/131 |
| 7,876,799 B2 * | 1/2011 | Yamatoya et al. | ........... | 372/50.1 |
| 8,058,709 B2 * | 11/2011 | Moriwaka | ................ | 257/628 |
| 8,063,408 B2 * | 11/2011 | Murata | ................ | 257/94 |
| 8,244,079 B2 * | 8/2012 | Kim et al. | ................ | 385/14 |

(Continued)

FOREIGN PATENT DOCUMENTS

| | | |
|---|---|---|
| JP | 2001-320076 A1 | 11/2001 |
| JP | 2003-163363 A1 | 6/2003 |

OTHER PUBLICATIONS

A. Beling, et al.; "InP-Based High-Speed Photodetectors;" Journal of Lightwave Technology; vol. 27; No. 3; Feb. 1, 2009; pp. 343-355/p. 3 of specification.

*Primary Examiner* — Ida M Soward

(74) *Attorney, Agent, or Firm* — Kratz, Quintos & Hanson, LLP

(57) ABSTRACT

A light receiving element includes a core configured to propagate a signal light, a first semiconductor layer having a first conductivity type, the first semiconductor layer being configured to receive the signal light from the core along a first direction in which the core extends, an absorbing layer configured to absorb the signal light received by the first semiconductor layer, and a second semiconductor layer having a second conductivity type opposite to the first conductivity type.

15 Claims, 22 Drawing Sheets

(56) References Cited

U.S. PATENT DOCUMENTS

| | | | |
|---|---|---|---|
| 8,410,420 B1* | 4/2013 | Hochberg et al. | 250/227.11 |
| 8,467,637 B2* | 6/2013 | Fujikata et al. | 385/14 |
| 8,472,760 B2* | 6/2013 | Hashimoto | 385/14 |
| 2003/0017681 A1* | 1/2003 | Yanagisawa et al. | 438/466 |
| 2004/0096175 A1* | 5/2004 | Tolstikhin | 385/131 |
| 2006/0039653 A1* | 2/2006 | Painter et al. | 385/50 |
| 2010/0246624 A1* | 9/2010 | Hiroyama et al. | 372/45.01 |
| 2010/0327385 A1* | 12/2010 | Shiba et al. | 257/432 |

* cited by examiner

600

1000

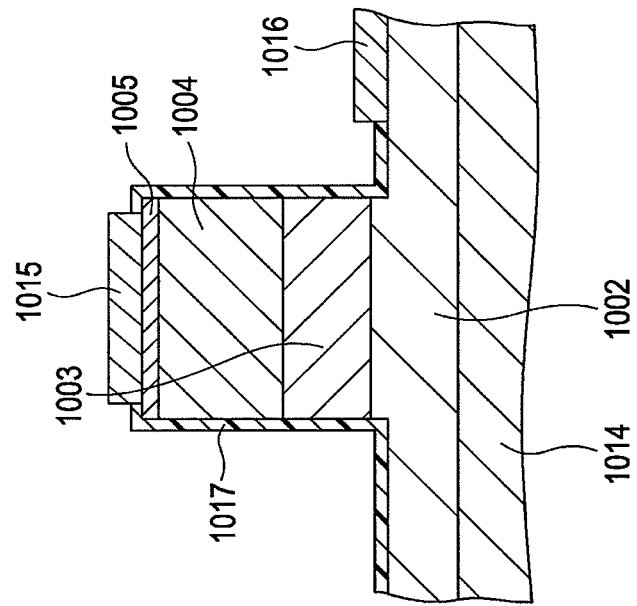
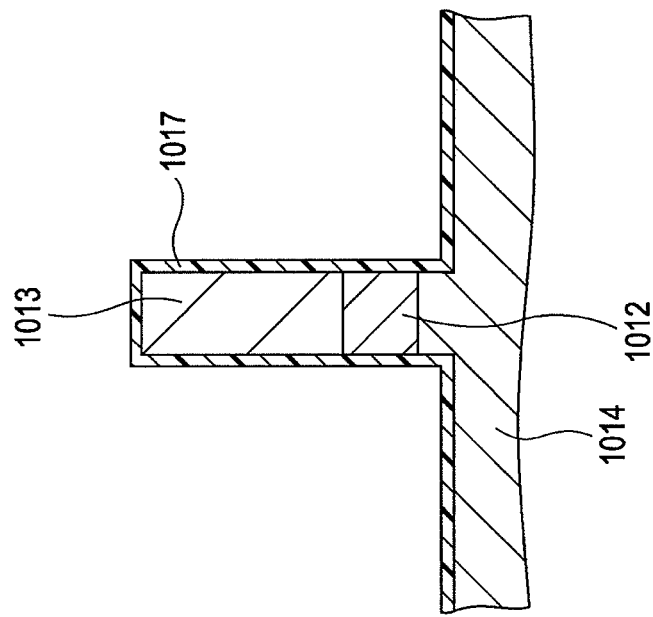

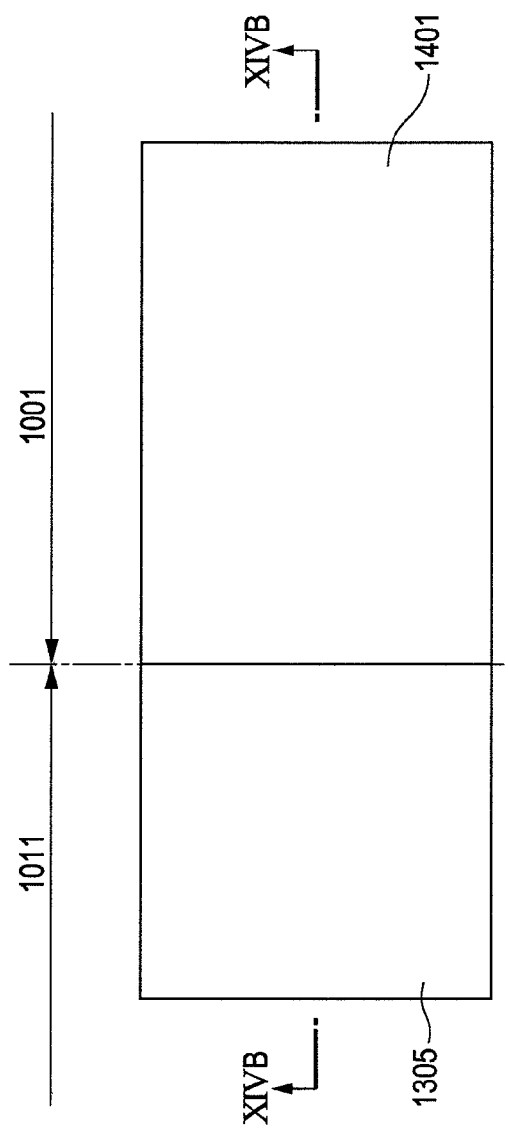
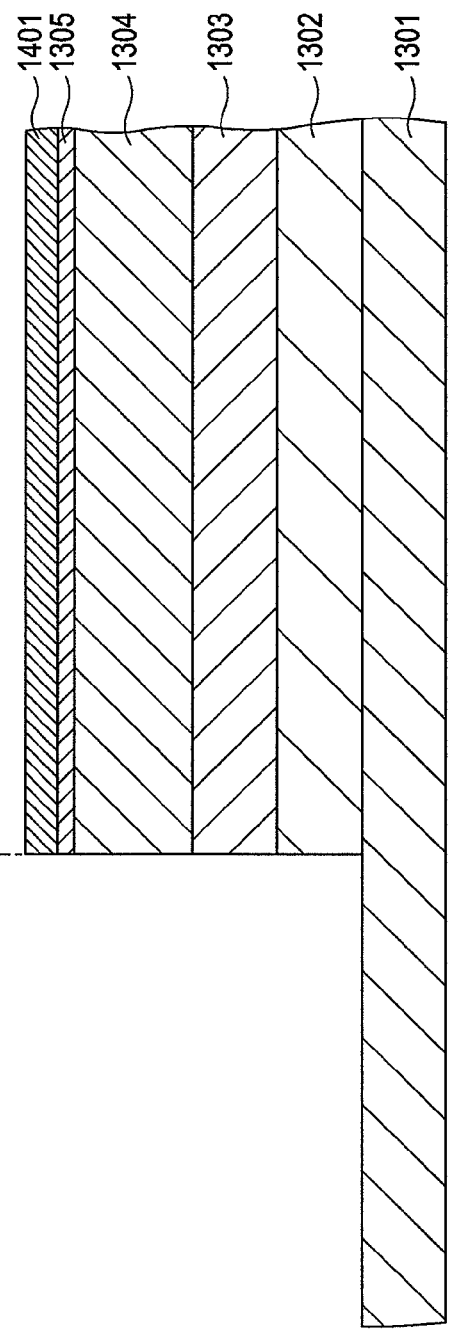
FIG. 14A
FIG. 14B

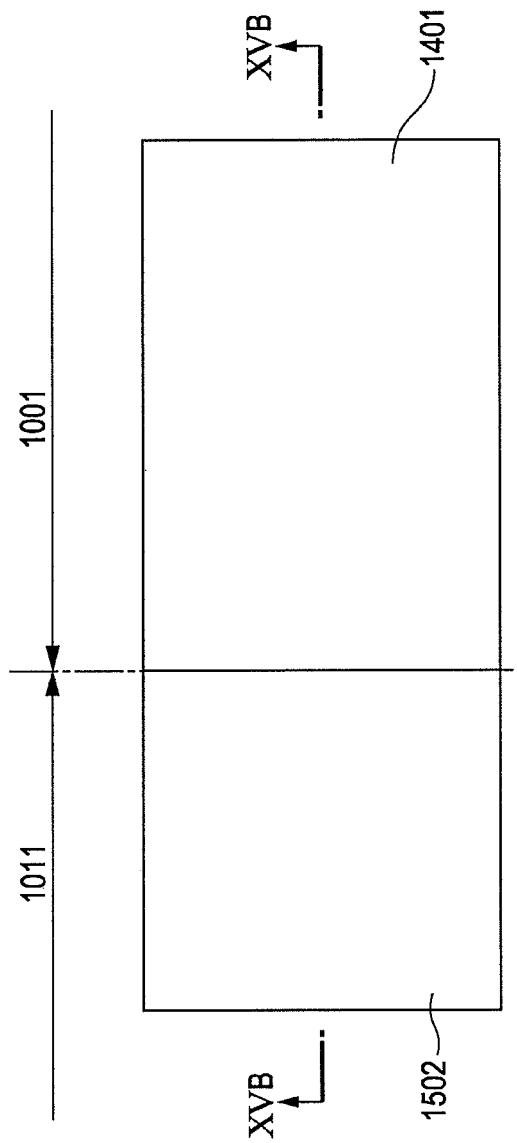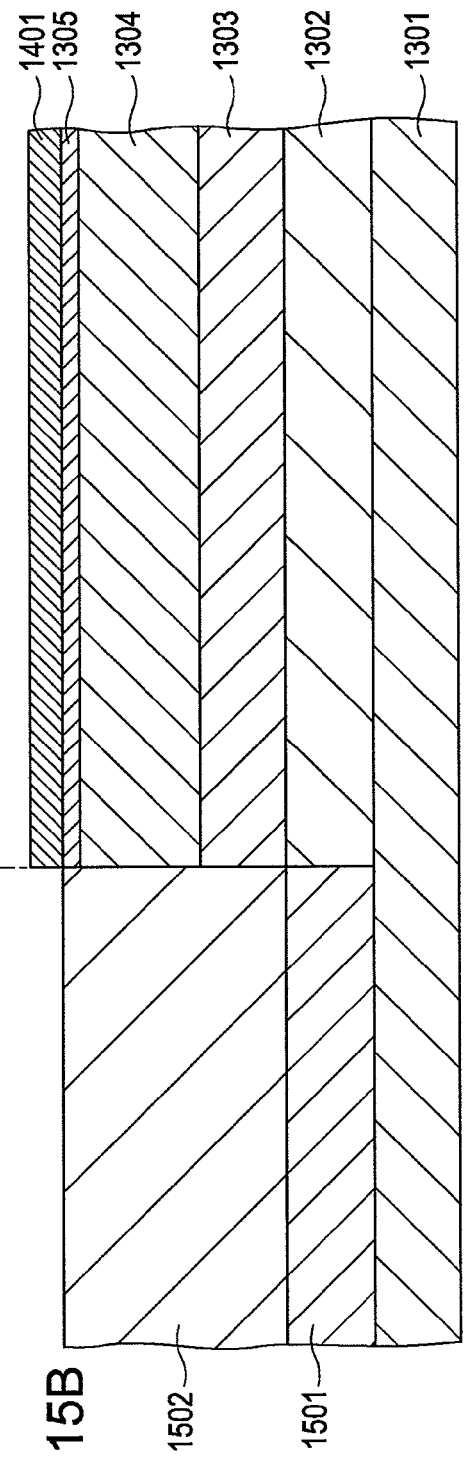
FIG. 15A
FIG. 15B

1800

LIGHT RECEIVING ELEMENT WITH OFFSET ABSORBING LAYER

CROSS-REFERENCE TO RELATED APPLICATION

This application is based upon and claims the benefit of priority of the prior Japanese Patent Application No. 2011-061842, filed on Mar. 20, 2011, the entire contents of which are incorporated herein by reference.

FIELD

The embodiments discussed herein are related to a light receiving element, a light receiving device, and a light receiving module.

BACKGROUND

FIG. 1 is a perspective view illustrating the main portion of a light receiving element 100 as an example of light receiving elements. FIG. 2 is a cross-sectional view of the light receiving element 100 taken along a broken line II-II in FIG. 1.

The light receiving element 100 illustrated as FIGS. 1 and 2 includes a photo-detector unit 101 provided over a substrate 114, and a waveguide unit 111 provided over the same substrate 114. The waveguide unit 111 includes a core 112 having a rib-like shape. A signal light propagates within a projection 113 of the core 112, and enters the photo-detector unit 101.

The photo-detector unit 101 has a structure in which the core 112, an n-type semiconductor layer 102, an i-type absorbing layer 103, a p-type upper clad layer 104, and a p-type contact layer 105 are laminated from the substrate 114 side. The photo-detector unit 101 has a mesa structure including the p-type contact layer 105, the p-type upper clad layer 104, and the i-type absorbing layer 103. The core 112 exists both in the photo-detector unit 101 and the waveguide unit 111.

As illustrated as FIG. 2, in the light receiving element 100, the signal light propagates below the projection 113 of the core 112 in the waveguide unit 111, and enters the core 112 in the photo-detector unit 101. Part of the incident signal light seeps out into the n-type semiconductor layer 102. As the signal light further propagates in the photo-detector unit 101, the signal light spreads to the i-type absorbing layer 103, and is absorbed in the i-type absorbing layer 103.

The n-type semiconductor layer 102, the i-type absorbing layer 103, and the p-type upper clad layer 104 form a PIN-type photo diode (hereinafter referred to as PD). A p-side electrode and an n-side electrode (not illustrated) are connected to the p-type contact layer 105 and the n-type semiconductor layer 102, respectively. By applying a predetermined voltage between the p-side electrode and the n-side electrode, with the p-side electrode at a negative potential and the n-side electrode at a positive potential, photocarriers (holes and electrons) generated by light absorption in the i-type absorbing layer 103 are detected via the p-type upper clad layer 104 and the n-type semiconductor layer 102. Thus, the photo-detector unit 101 detects the signal light as an electrical signal (photocarrier current), and outputs a detection signal (photocarrier current) corresponding to the intensity of the signal light.

FIG. 3 illustrates the main portion of a light receiving element 300 as another example of light receiving element. FIG. 4 is a cross-sectional view of the light receiving element 300 taken along a broken line IV-IV in FIG. 3.

The light receiving element 300 illustrated as FIGS. 3 and 4 has a structure different from that of the light receiving element 100 illustrated as FIGS. 1 and 2. The light receiving element 300 includes a photo-detector unit 301 provided over a substrate 314, and a waveguide unit 311 provided over the same substrate 314.

The waveguide unit 311 has a structure in which an n-type lower clad layer 302, a core 312, and an upper clad layer 313 are laminated from the substrate 314 side. The waveguide unit 311 has a mesa structure including the upper clad layer 313 and the core 312. A signal light propagates in the core 312, and enters the photo-detector unit 301.

The photo-detector unit 301 has a structure in which the n-type lower clad layer 302, an i-type absorbing layer 303, a p-type upper clad layer 304, and a p-type contact layer 305 are laminated from the substrate 314 side. The photo-detector unit 301 has a mesa structure including the p-type contact layer 305, the p-type upper clad layer 304, and the i-type absorbing layer 303.

The core 312 and the i-type absorbing layer 303 are both formed on the n-type lower clad layer 302 that is shared by the photo-detector unit 301 and the waveguide unit 311. The core 312 is connected to a side face of the i-type absorbing layer 303.

As illustrated as FIG. 4, in the light receiving element 300, the signal light propagates in the core 312 in the waveguide unit 311, and directly enters the i-type absorbing layer 303 in the photo-detector unit 301. The incident signal light is absorbed in a region near the end of the i-type absorbing layer 303 from which the signal light enters.

The n-type lower clad layer 302, the i-type absorbing layer 303, and the p-type upper clad layer 304 form a PIN-type photodiode. A p-side electrode and an n-side electrode are connected to the p-type contact layer 305 and the n-type lower clad layer 302, respectively. By applying a predetermined voltage between the p-side electrode and the n-side electrode, with the p-side electrode at a negative potential and the n-side electrode at a positive potential, photocarriers (holes and electrons) generated by light absorption in the i-type absorbing layer 303 are detected via the p-type upper clad layer 304 and the n-type lower clad layer 302. Thus, the photo-detector unit 301 detects the signal light as an electrical signal (photocarrier current), and outputs a detection signal (photocarrier current) corresponding to the intensity of the signal light.

An example of the two light receiving elements 100 and 300 illustrated as FIGS. 1 to 4 is discussed in Japanese Laid-open Patent Publication No. 2003-163363 and Andreas Beling et al. *J. Lightwave Tech.*, VOL. 27, NO. 3, pp 343-355, Feb. 1, 2009.

FIG. 5 illustrates an example of simulated density distributions of photocarriers generated in the photo-detector units 101 and 301. The vertical axis represents the density of photocarriers as normalized on the basis of a predetermined value. The horizontal axis represents location inside the PD in each of the photo-detector units 101 and 301. In this specification, the term "location inside the PD" refers to a location inside the PD along the direction in which the corresponding core extends, that is, the direction of travel of the signal light, and means a location inside the PD included in the photo-detector unit with reference to the end from which the signal light enters. Also, the term "PD length" refers to the length of the PD in the photo-detector unit along the direction in which the corresponding core extends, that is, the direction of travel of the signal light, and means the length of the PD in the photo-detector unit with reference to the end from which the signal light enters.

In FIG. 5, the curve indicated by (a) represents photocarrier density distribution in the photo-detector unit 101 illustrated as FIGS. 1 and 2, and the curve indicated by (b) represents photocarrier density distribution in the photo-detector unit 301 illustrated as FIGS. 3 and 4.

In the photo-detector unit 101 of the light receiving element 100, the signal light seeps out into the i-type absorbing layer 103 after propagating through the core 112 and the n-type semiconductor layer 102 in the photo-detector unit 101 by a predetermined distance, and absorption thus takes place. Accordingly, as is apparent from the distribution curve (a) in FIG. 5, the peak of the photocarrier density distribution occurs at a location separated by a predetermined distance from the end of the photo-detector unit 101 from which the signal light enters. Moreover, the overall density distribution also spreads to a location farther away from the end of the photo-detector unit 101, so the distribution has a large spread as a whole.

Therefore, in the photo-detector unit 101, the PD length of the photo-detector unit 101 is set to a sufficient length for obtaining sufficient absorption efficiency. However, making the PD length of the photo-detector unit 101 longer increases the size of the capacitor including the n-type semiconductor layer 102, the i-type absorbing layer 103, and the p-type upper clad layer 104, causing an increase in capacitance of the photo-detector unit 101. Thus, the cut-off frequency derived from the CR time constant becomes lower in the transmission path between the light receiving element 100 and the subsequent electrical circuit. Consequently, in the subsequent electrical circuit that receives an electrical signal outputted from the light receiving element 100, the level of the input signal attenuates at high frequencies, making it difficult to appropriately process the input signal also at high frequencies.

As a result, with the structure of the light receiving element 100 illustrated as FIGS. 1 and 2, it is difficult to supply a detection signal with sufficient signal level to the subsequent electrical circuit while ensuring high light absorption efficiency.

On the other hand, in the photo-detector unit 301 of the light receiving element 300, the signal light having propagated through the core 312 directly enters the i-type absorbing layer 303. Consequently, large absorption takes place in the vicinity of the end of the photo-detector unit 301. Thus, as is apparent from the distribution curve (b) in FIG. 5, photocarriers generate and their density becomes high within a narrow range near the end of the photo-detector unit 301 from which the signal light enters.

Therefore, in the photo-detector unit 301, high light absorption efficiency is obtained even if the PD length is short. However, since the rising edge of the photocarrier density distribution is so large near the end of the photo-detector unit 301 that in the case of high intensity light input where the intensity of the inputted signal light is high, the density of photocarriers locally generated near the end of the photo-detector unit 301 becomes excessively high. As a result, in the photo-detector unit 301, a large electric field is created between the p-type upper clad layer 304 and the n-type lower clad layer 302 by the excessive locally generated photocarriers, in a direction opposite to the electric field created by the above-mentioned voltage applied between the p-side electrode and the n-side electrode. The electric field created by the excessive locally generated photocarriers acts to cancel out the electrical field created by the above-mentioned voltage applied between the p-side electrode and the n-side electrode. This makes it difficult for the photo-detector unit 301 to appropriately detect the photocarriers (holes and electrons) generated by light absorption in the i-type absorbing layer 303 via the p-type upper clad layer 304 and the n-type lower clad layer 302. Consequently, the high frequency property for high intensity signal light deteriorates.

As a result, with the structure of the light receiving element 300 illustrated as FIGS. 3 and 4, it is difficult to perform an output operation adapted to high intensity light input.

SUMMARY

According to an aspect of the invention, a light receiving element includes a core configured to propagate a signal light, a first semiconductor layer having a first conductivity type, the first semiconductor layer being configured to receive the signal light from the core along a first direction, the core extending in the first direction, an absorbing layer configured to absorb the signal light received by the first semiconductor layer, and a second semiconductor layer having a second conductivity type opposite to the first conductivity type.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 12A and 12B are cross-sectional views of a light receiving element taken along broken lines XIIA-XIIA and XIIB-XIIB in FIG. 10, respectively;

FIGS. 14A and 14B illustrate an example of the manufacturing process of the light receiving element illustrated as FIGS. 10 to 12B (Part 2);

FIGS. 15A and 15B illustrate an example of the manufacturing process of the light receiving element illustrated as FIGS. 10 to 12B (Part 3);

DESCRIPTION OF EMBODIMENTS

Hereinafter, the embodiments are described.
Embodiments
[1. First Embodiment]
[1-1. Structure of a Light Receiving Element 600]

Figure 6:
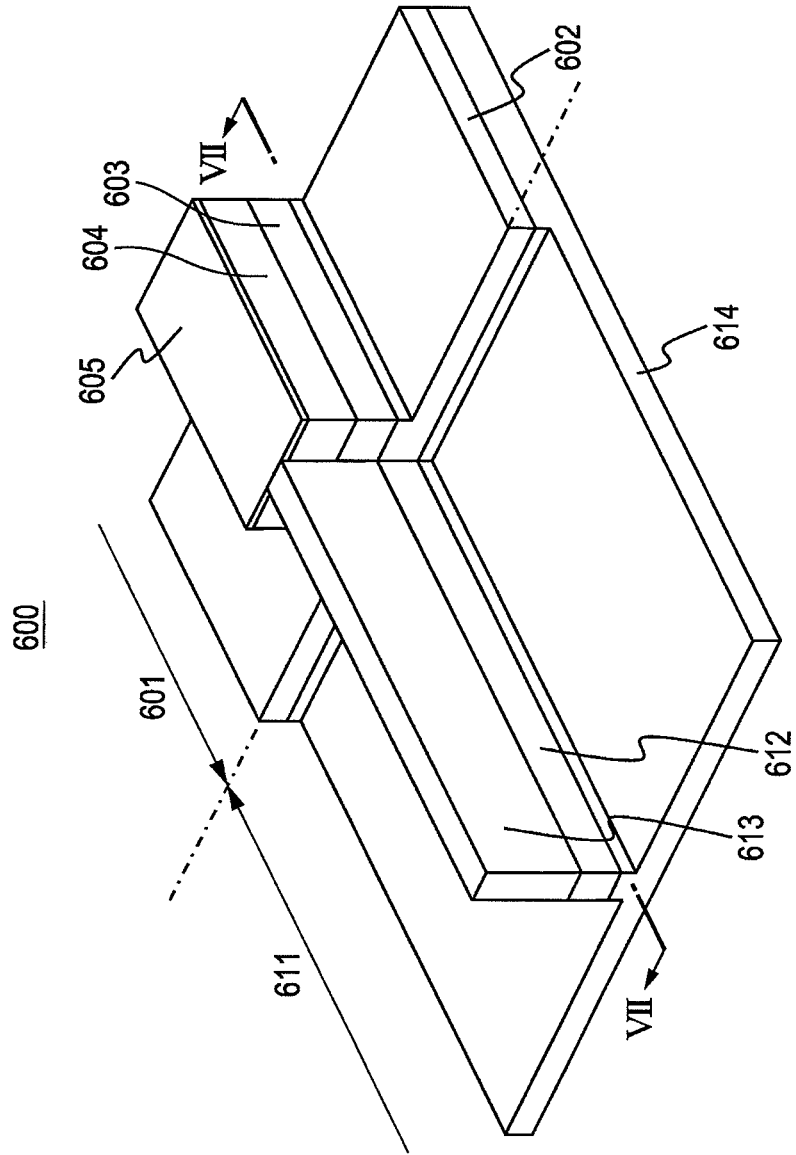
FIG. 6 is a perspective view illustrating an example of the structure of a light receiving element according to a first embodiment.
Figure 7:
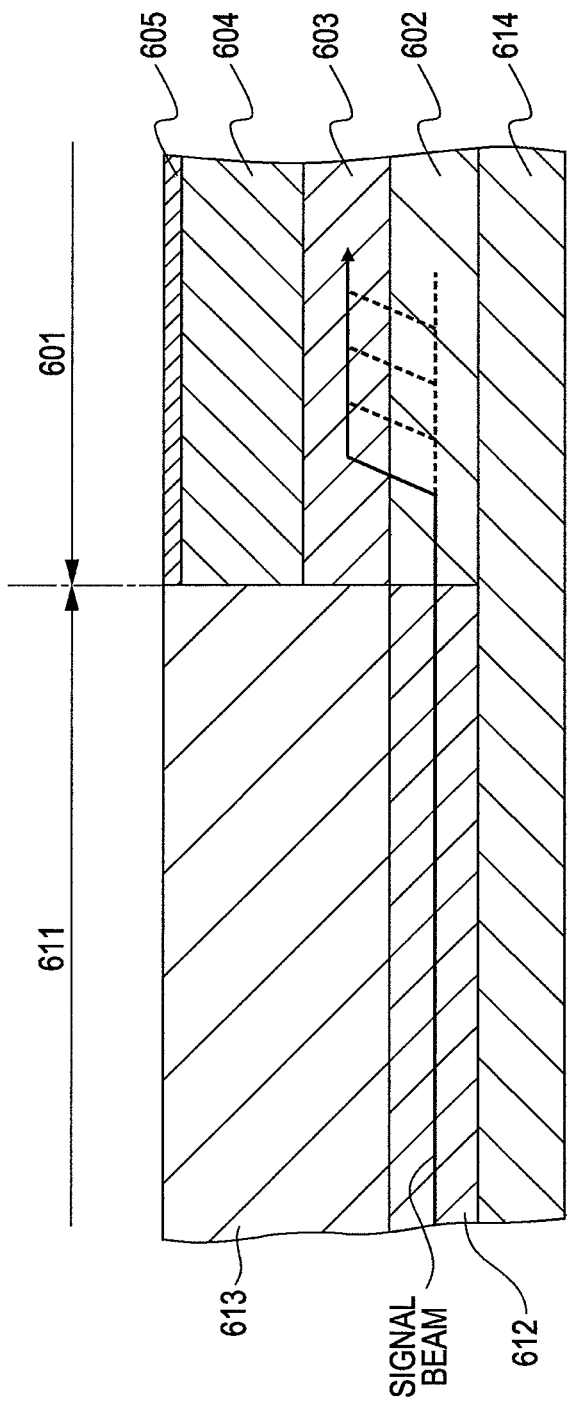
FIG. 7 is a cross-sectional view of a light receiving element taken along a broken line VII-VII in FIG. 6.

FIG. 6 is a perspective view illustrating an example of the structure of a light receiving element 600 according to a first embodiment. FIG. 6 illustrates only the main portion of the light receiving element 600. FIG. 7 is a cross-sectional view of the light receiving element 600 taken along a broken line VII-VII in FIG. 6. FIG. 7 illustrates the vicinity of the boundary region between a photo-detector unit 601 and a waveguide unit 611.

In this specification, with respect to the side of the substrate surface on which the structure of a light receiving element is formed, the direction pointing away from the substrate surface is referred to as "upper", "top", "over", "on" or "above", and the direction pointing towards the substrate surface is referred to as "lower", "bottom", "under", or "below".

As illustrated as FIGS. 6 and 7, the light receiving element 600 includes the photo-detector unit 601 provided over a substrate 614, and the waveguide unit 611 provided over the same substrate 614.

The waveguide unit 611 has a structure in which a core 612 and an upper clad layer 613 are laminated from the substrate 614 side. The material of each of the layers of this laminate structure is, for example, a semiconductor. The waveguide unit 611 has a mesa structure including the upper clad layer 613 and the core 612. A signal light propagates in the core 612, and enter the photo-detector unit 601.

The photo-detector unit 601 has a structure in which an n-type semiconductor layer 602, an i-type absorbing layer 603, a p-type upper clad layer 604, and a p-type contact layer 605 are laminated from the substrate 614 side. The material of each of the layers of this laminate structure is, for example, a semiconductor. The photo-detector unit 601 has a mesa structure including the p-type contact layer 605, the p-type upper clad layer 604, the i-type absorbing layer 603, and part of the n-type semiconductor layer 602. The n-type semiconductor layer 602, the i-type absorbing layer 603, and the p-type upper clad layer 604 form a PIN-type photodiode.

As illustrated as FIG. 7, in the light receiving element 600, the core 612 is connected to a side face of the n-type semiconductor layer 602, and the core 612 and the n-type semiconductor layer 602 are connected adjacent to each other along the direction in which the core 612 extends. The core 612 is so formed that its top face is located higher than the bottom face of the n-type semiconductor layer 602 (located farther away from the substrate 614), and its bottom face is located lower than the top face of the n-type semiconductor layer 602 (located closer to the substrate 614).

The n-type semiconductor layer 602 is so formed that its refractive index is higher than the refractive index of the core 612, and lower than the refractive index of the i-type absorbing layer 603. That is, the n-type semiconductor layer 602 is so formed that its bandgap wavelength is longer than the bandgap wavelength of the core 612, and shorter than the bandgap wavelength of the i-type absorbing layer 603. The n-type semiconductor layer 602 is formed so as to have a composition that makes the absorption coefficient for the signal light sufficiently small.

As illustrated as FIG. 7, in the light receiving element 600, the signal light propagates in the core 612 in the waveguide unit 611, and enters the n-type semiconductor layer 602 in the photo-detector unit 601. The n-type semiconductor layer 602 receives the signal light from the core 612 along the direction in which the core 612 extends. Since the refractive index of the n-type semiconductor layer 602 is set higher than the refractive index of the core 612, the loss at the time when the signal light enters the n-type semiconductor layer 602 from the core 612 can be reduced. Part of the incident signal light seeps out from the n-type semiconductor layer 602 into the i-type absorbing layer 603, and is absorbed in the i-type absorbing layer 603.

A p-side electrode and an n-side electrode (not illustrated) are connected to the p-type contact layer 605 and the n-type semiconductor layer 602, respectively. By applying a predetermined voltage between the p-side electrode and the n-side electrode, with the p-side electrode at a negative potential and the n-side electrode at a positive potential, photocarriers (holes and electrons) generated by light absorption in the i-type absorbing layer 603 are detected via the p-type upper clad layer 604 and the n-type semiconductor layer 602. Thus, the photo-detector unit 601 detects the signal light as an electrical signal, and generates the detection signal as an electrical signal (photocarrier current). The photo-detector unit 601 outputs the detection signal (photocarrier current) corresponding to the intensity of the signal light to the subsequent electrical circuit.

Figure 1:
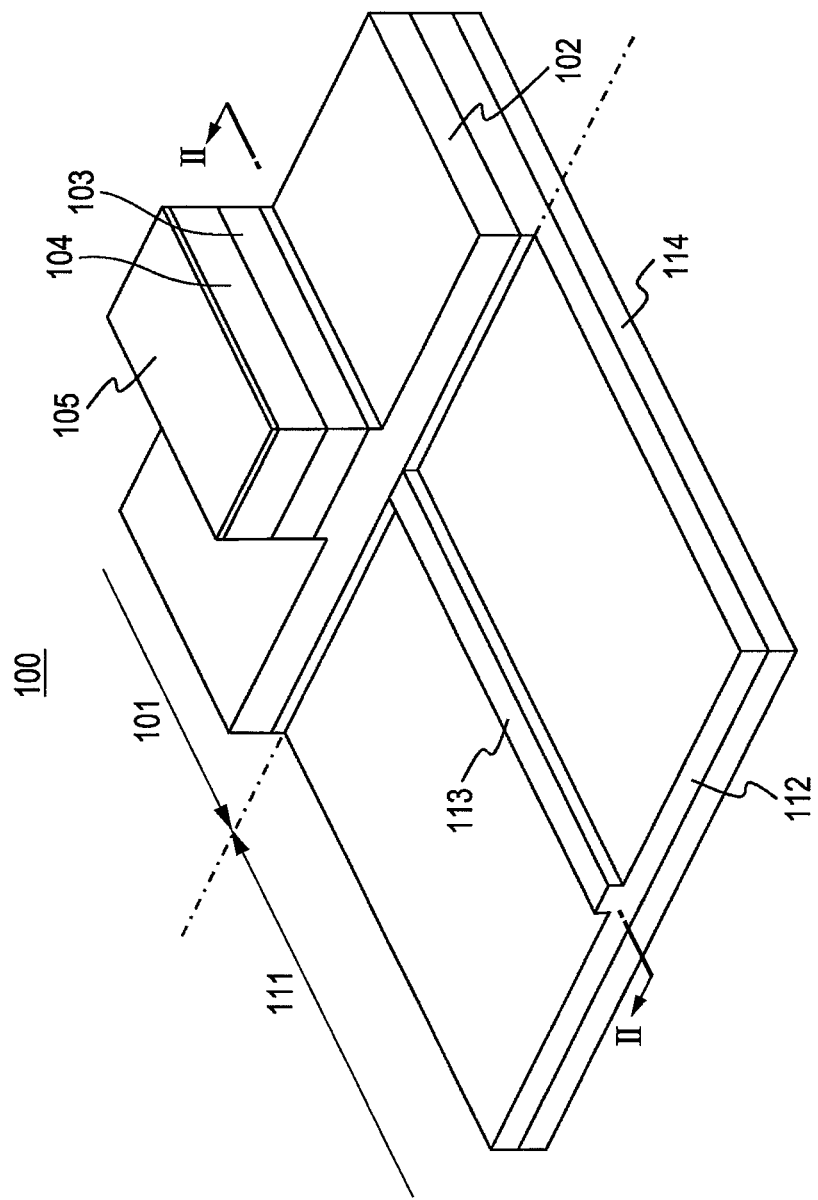
FIG. 1 is a perspective view illustrating an example of a light receiving element.
Figure 2:
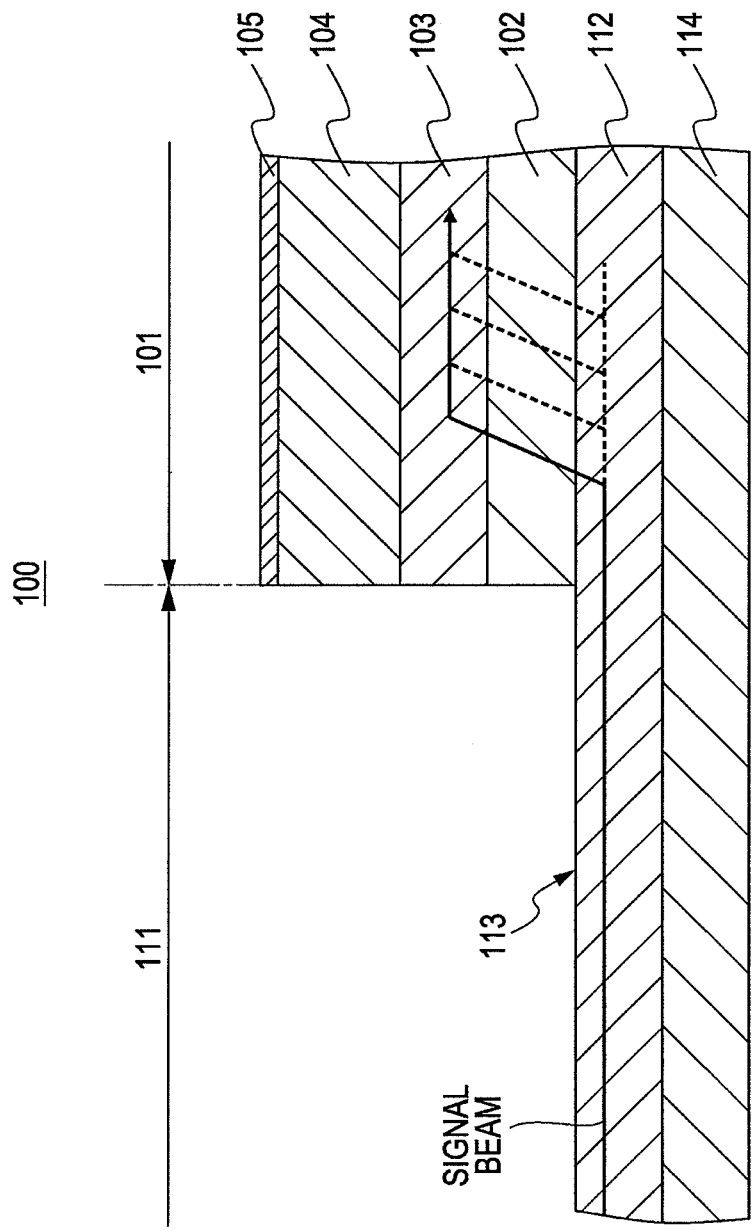
FIG. 2 is a cross-sectional view of a light receiving element taken along a broken line II-II in FIG. 1.

In the photo-detector unit 601, unlike in the photo-detector unit 101 of the light receiving element 100 illustrated as FIGS. 1 and 2, the signal light enters the n-type semiconductor layer 602 which is directly in contact with the i-type absorbing layer 603 in which absorption of the signal light takes place. Consequently, in the photo-detector unit 601, as soon as the signal light enters the n-type semiconductor layer 602, the signal light seeps out into the i-type absorbing layer 603, so that absorption of the signal light begins immediately after the entry. Consequently, in the photo-detector unit 601, the PD length can be made shorter than the PD length of the photo-detector unit 101 while ensuring sufficient light absorption efficiency.

Because the PD length can be shortened in the photo-detector unit 601, the size of the capacitor including the n-type semiconductor layer 602, the i-type absorbing layer 603, and the p-type upper clad layer 604 can be made smaller. Consequently, capacitance of the photo-detector unit 601 can be reduced, and thus the cut-off frequency derived from the CR time constant becomes higher in the transmission path between the light receiving element 600 and the subsequent electrical circuit. Consequently, the light receiving element 600 can supply a detection signal with sufficient signal level to the subsequent electrical circuit also at high frequencies, making it possible for the subsequent electrical circuit to process an input signal also at high frequencies.

Figure 3:
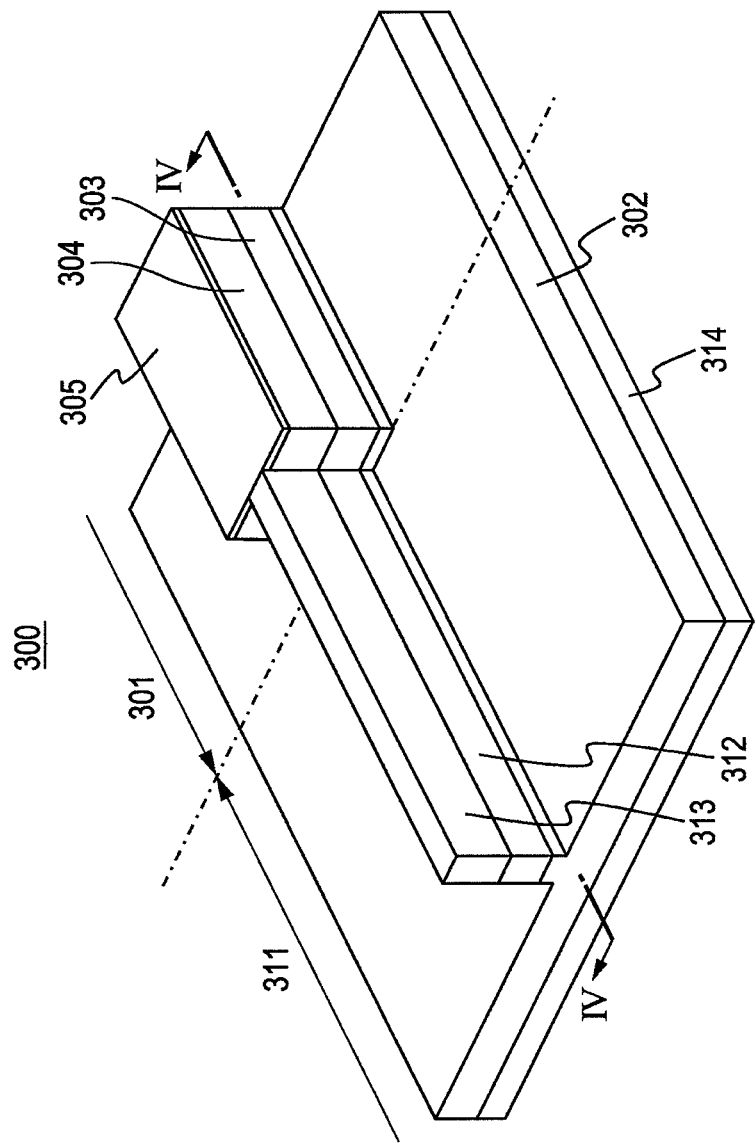
FIG. 3 is a perspective view illustrating another example of a light receiving element.
Figure 4:
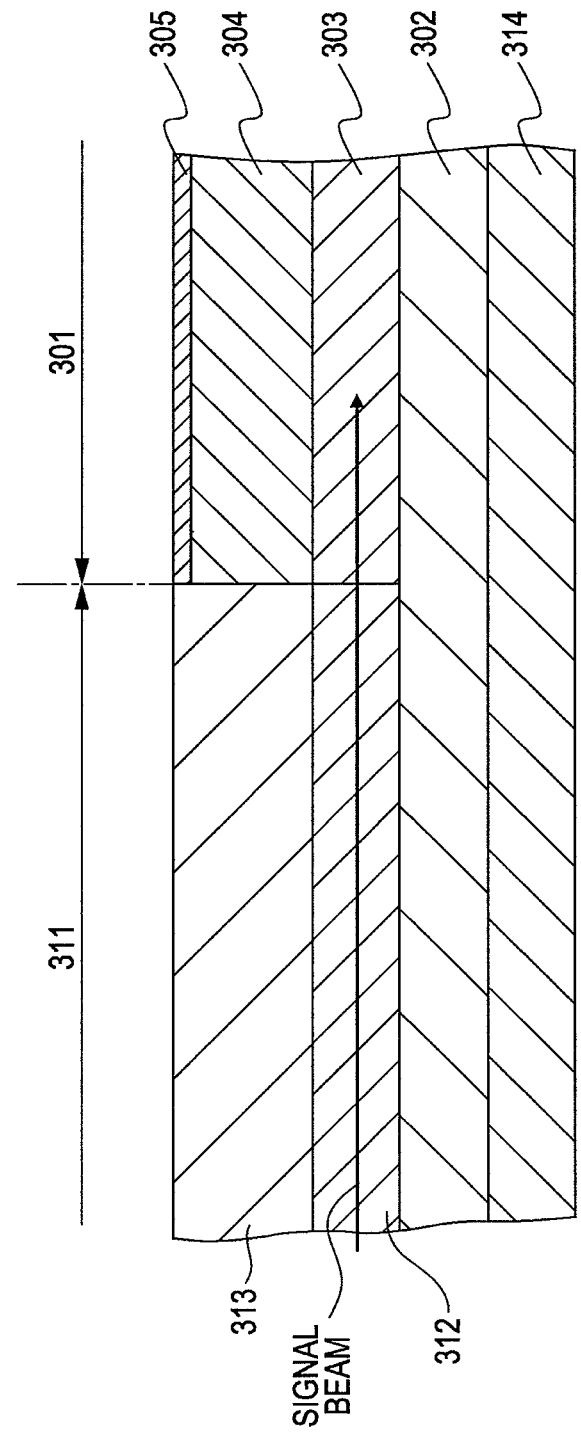
FIG. 4 is a cross-sectional view of a light receiving element taken along a broken line IV-IV in FIG. 3.

In addition, in the light receiving element 600, unlike in the photo-detector unit 301 of the light receiving element 300 illustrated as FIGS. 3 and 4, the signal light does not directly enter the i-type absorbing layer 603 but enters the n-type semiconductor layer 602 first, and then its components seeping out into the i-type absorbing layer 603 are absorbed. Consequently, in the photo-detector unit 601, the overall density distribution of generated photocarriers is a flat, gently sloping distribution in comparison to that in the photo-detector unit 301.

Consequently, in the photo-detector unit 601, an excessive increase in local photocarrier density can be reduced even in the case of high intensity light input where the intensity of the inputted signal light is high. Thus, in the photo-detector unit 601, it is possible to reduce deterioration of high frequency property for high intensity signal light due to the influence of an electric field created by photocarriers (holes and electrons). Therefore, in the light receiving element 600, it is possible to perform an output operation adapted to high intensity light input.

As has been described above, in the light receiving element 600, a detection signal with sufficient signal level can be supplied to the subsequent electrical circuit also at high frequencies while improving the efficiency of light absorption in the photo-detector unit 601. Further, the light receiving element 600 can perform an output operation adapted to high intensity light input in which the intensity of the input signal light is high.

[1-2. Photocarrier Density Distribution in the Photo-detector Unit 601]

Figure 8:
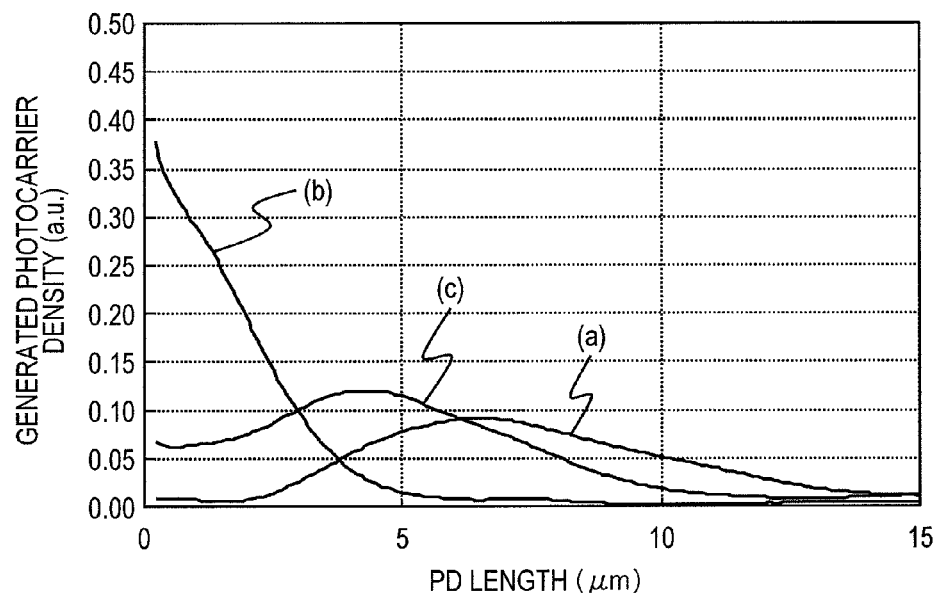
FIG. 8 illustrates an example of the simulated density distribution of photocarriers generated in a photo-detector unit of a light receiving element.

FIG. 8 illustrates an example of the simulated density distribution of photocarriers generated in the photo-detector unit 601 of the light receiving element 600. The vertical axis represents the density of photocarriers as normalized on the basis of a predetermined value. The horizontal axis represents location inside the PD in the photo-detector unit 601.

Figure 5:
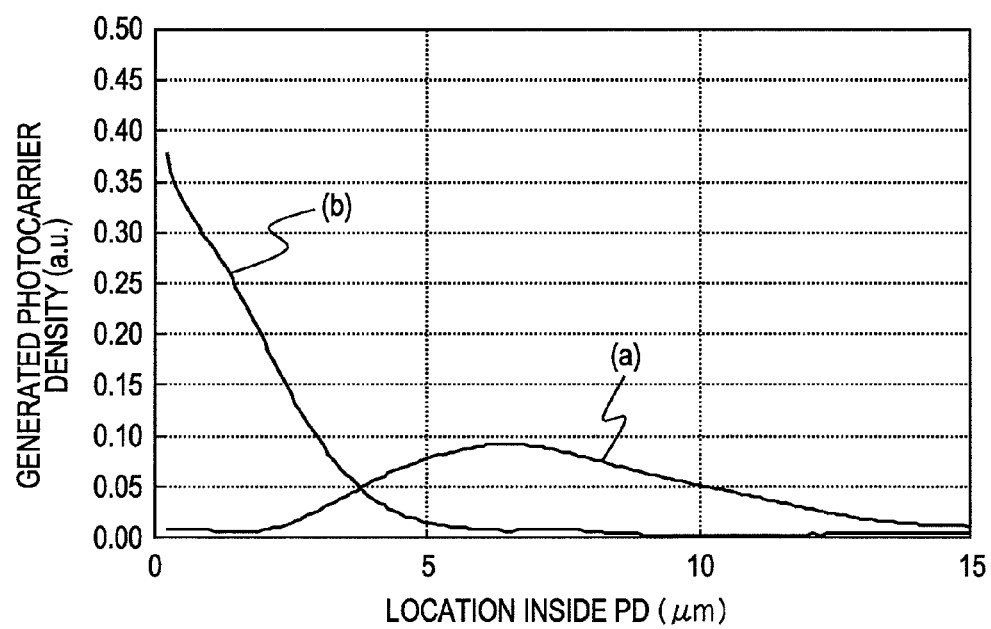
FIG. 5 illustrates an example of simulated light absorption distributions in photo-detector units.

In FIG. 8, the curve indicated by (c) represents photocarrier density distribution in the photo-detector unit 601 of the light receiving element 600 illustrated as FIGS. 6 and 7. In FIG. 8, for the sake of comparison, photocarrier density distribution in the photo-detector unit 101 of the light receiving element 100 illustrated as FIGS. 1 and 2 is represented as the curve (a), and photocarrier density distribution in the photo-detector unit 301 of the light receiving element 300 illustrated as FIGS. 3 and 4 is represented as the curve (b). The distribution curves (a) and (b) in FIG. 8 are the same as the distribution curves (a) and (b) in FIG. 5, respectively.

As represented as the distribution curve (c), in the case of the light receiving element 600, as compared with the light receiving element 100 (distribution curve (a)), the peak of the photocarrier density distribution is located closer to the end of the photo-detector unit 601. Accordingly, the overall photocarrier density distribution is also shifted to the side closer to the end of the photo-detector unit 601, and the spread of the distribution as a whole is also small.

Therefore, in the light receiving element 600, the PD length of the photo-detector unit 601 can be made shorter than the PD length of the photo-detector unit 101 in the light receiving element 100 while ensuring sufficient light absorption efficiency. For example, it is estimated from the amount of shift of the peak location that, in order to obtain the same light absorption coefficient, about ⅔ of the PD length of the photo-detector unit 101 is sufficient as the PD length of the photo-detector unit 601.

Because the PD length can be shortened, capacitance of the photo-detector unit 601 also becomes smaller than the capacitance of the photo-detector unit 101. Thus, the light receiving element 600 can supply a detection signal with sufficient signal level to the subsequent electrical circuit also at high frequencies, making it possible for the subsequent electrical circuit to process an input signal also at high frequencies.

In addition, as represented as the distribution curve (c), in the light receiving element 600, the peak of the photocarrier density distribution is sufficiently low in comparison to that in the light receiving element 300 (distribution curve (b)). In the light receiving element 600, the value of density at the peak location of the photocarrier density distribution is sufficiently small in comparison to the maximum value of density in the case of the light receiving element 300 (distribution curve (b)). Also, the density distribution as a whole is a flat, gently sloping distribution as compared with that of the light receiving element 300 (distribution curve (b)).

Therefore, an excessive increase in local photocarrier density can be reduced even in the case of high intensity light input where the intensity of the inputted signal light is high. Thus, in the light receiving element 600, it is possible to reduce deterioration of high frequency property for high intensity signal light.

As has been described above, in the light receiving element 600, a detection signal with sufficient signal level can be supplied to the subsequent electrical circuit also at high frequencies while improving the efficiency of light absorption in the photo-detector unit 601. Further, the light receiving element 600 can perform an output operation adapted to high intensity light input in which the intensity of the input signal light is high.

[1-3. Quantum Efficiency in the Photo-detector Unit 601]

Figure 9:
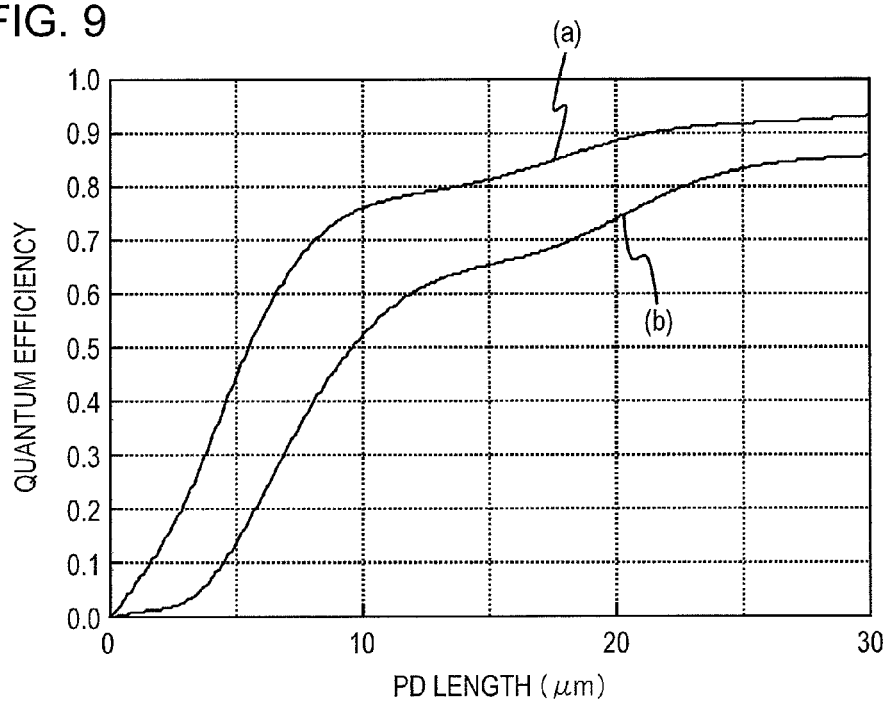
FIG. 9 illustrates an example of simulated quantum efficiency in a photo-detector unit of a light receiving element.

FIG. 9 illustrates an example of simulated quantum efficiency in the photo-detector unit 601 of the light receiving element 600. The vertical axis represents quantum efficiency. The horizontal axis represents the PD length of the photo-detector unit 601.

In FIG. 9, the curve indicated by (a) represents quantum efficiency in the photo-detector unit 601 of the light receiving element 600 illustrated as FIGS. 6 and 7. In FIG. 9, for the sake of comparison, quantum efficiency in the photo-detector unit 101 of the light receiving element 100 illustrated as FIGS. 1 and 2 are represented as the curve (b).

As is apparent from FIG. 9, the quantum efficiency of the light receiving element 600 is generally higher than the quantum efficiency of the light receiving element 100. That is, the light receiving element 600 can improve quantum efficiency by adopting the structure illustrated as FIGS. 6 and 7 in comparison to the light receiving element 100. For example, to obtain a quantum efficiency of 80%, a length that is about 60% of the PD length of the light receiving element 100 is sufficient as the PD length of the light receiving element 600. Also, for example, with the same PD length of 10 μm, the light receiving element 600 can provide a quantum efficiency about 1.5 times higher than that of the light receiving element 100.

Therefore, in the light receiving element 600, the efficiency of light absorption in the photo-detector unit 601 can be improved.

[1-4. Specific Example of the Structure of the Light Receiving Element 600]

Figure 10:
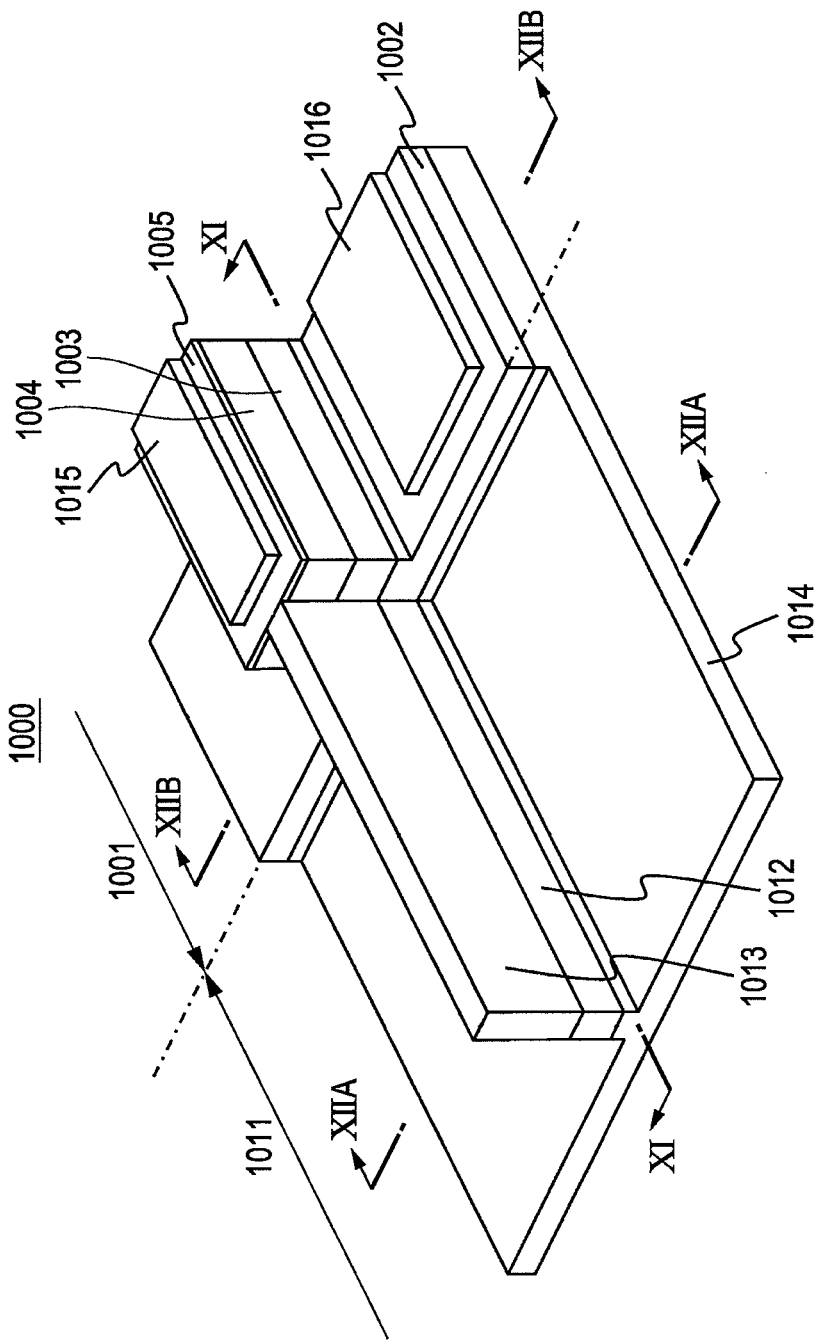
FIG. 10 is a perspective view illustrating an example of the structure of a light receiving element.
Figure 11:
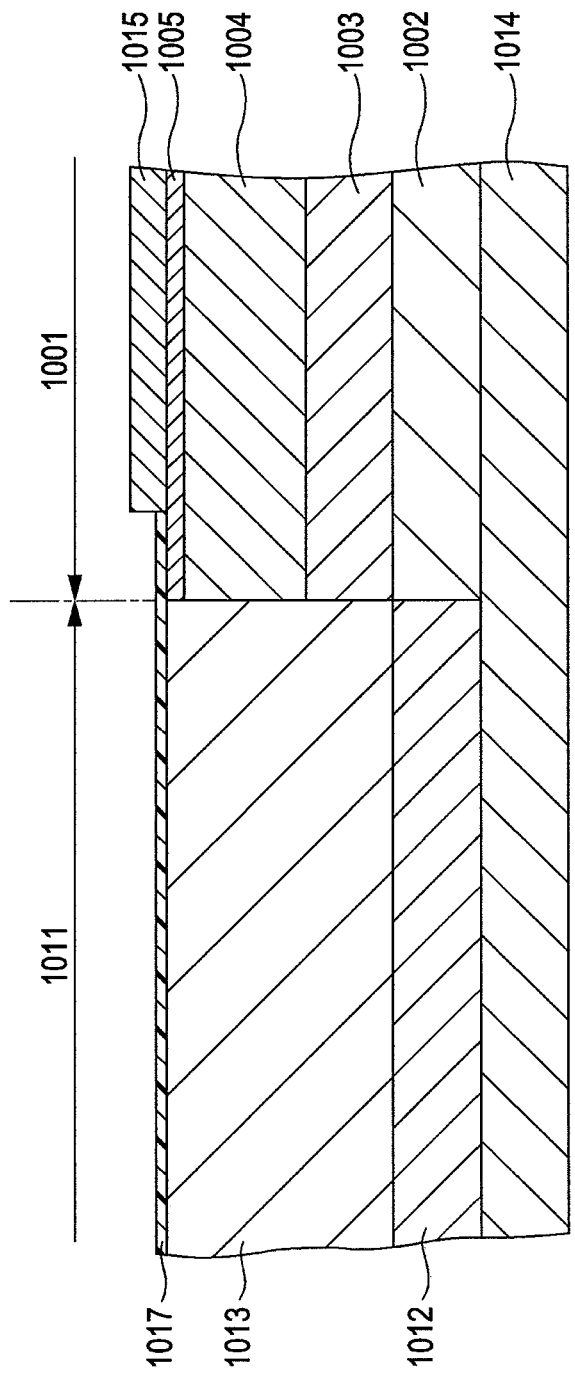
FIG. 11 is a cross-sectional view of a light receiving element taken along a broken line XI-XI in FIG. 10.

FIG. 10 is a perspective view illustrating an example of the structure of a light receiving element 1000. FIG. 10 illustrates only the main portion of the light receiving element 1000. The structure of the light receiving element 1000 illustrated as FIG. 10 is a specific example of the structure of the light receiving element 600 illustrated as FIG. 6, and specifically illustrates a configuration example of each layer of the light receiving element 600. FIG. 11 is a cross-sectional view of the light receiving element 1000 taken along a broken line XI-XI in FIG. 10. FIG. 11 illustrates the vicinity of the boundary region between a photo-detector unit 1001 and a waveguide unit 1011. FIG. 12A is a cross-sectional view of the light receiving element 1000 taken along a broken line XIIA-XIIA in FIG. 10, illustrating the vicinity of a mesa structure. FIG. 12B is a cross-sectional view of the light receiving element 1000 taken along a broken line XIIB-XIIB in FIG. 10, illustrating the vicinity of a mesa structure.

As illustrated as FIGS. 10 to 12B, the light receiving element 1000 includes, for example, the photo-detector unit 1000 provided over an semi-insulating (hereinafter referred to as SI) InP substrate 1014 and the waveguide unit 1011 provided over the same SI-InP substrate 1014. An element that forms a deep impurity level such as Fe is doped in the SI-InP substrate 1014.

The waveguide unit 1011 has a structure in which an i-InGaAsP core layer 1012 made of i-type InGaAsP having a bandgap wavelength of 1.05 μm and an i-InP clad layer 1013 made of i-type InP are laminated from the SI-InP substrate 1014 side. The waveguide unit 1011 has a mesa structure including the i-InP clad layer 1013 and the i-InGaAsP core layer 1012, and has a high-mesa waveguide structure whose side faces are not buried with a semiconductor material.

The photo-detector unit 1001 has a structure in which an n-InGaAsP semiconductor layer 1002 made of n-type InGaAsP having a bandgap wavelength of 1.3 μm, an i-InGaAs absorbing layer 1003 made of i-type InGaAs lattice-matched with InP, a p-InP clad layer 1004 made of p-type InP, and a p-type contact layer 1005 made up of a two-layer structure of p-type InGaAs and InGaAsP are laminated from the SI-InP substrate 1014 side.

The photo-detector unit 1001 has a mesa structure including the p-type contact layer 1005, the p-InP clad layer 1004, the i-InGaAs absorbing layer 1003, and part of the n-InGaAsP semiconductor layer 1002. The photo-detector unit 1001 has a high-mesa waveguide structure whose side faces are not buried with a semiconductor material. The n-InGaAsP semiconductor layer 1002, the i-InGaAs absorbing layer 1003, and the p-InP clad layer 1004 form a PIN-type photodiode.

A p-side electrode 1015 is formed over the p-type contact layer 1005, and an n-side electrode 1016 is formed over the n-InGaAsP semiconductor layer 1002. The portion of the light receiving element 1000 where the p-side electrode 1015 and the n-type electrode 1016 are not formed is covered with a passivation film 1017 made of a dielectric such as a silicon nitride film. In FIG. 10, the passivation film 1017 is not illustrated to facilitate understanding of the structure.

A predetermined voltage with the p-side electrode 1015 at a negative potential and the n-side electrode 1016 at a positive potential is applied between the p-side electrode 1015 and the n-side electrode 1016. Thus, photocarriers (holes and electrons) generated by light absorption in the i-InGaAs absorbing layer 1003 are detected via the p-InP clad layer 1004 and the n-InGaAsP semiconductor layer 1002.

In the waveguide unit 1011, for example, the thickness of the i-InGaAsP core layer 1012 is set to 0.5 μm, and the thickness of the i-InP clad layer 1013 is set to 1.5 μm. In the photo-detector unit 1001, for example, the thickness of the n-InGaAsP semiconductor layer 1002 is set to 0.5 μm, the thickness of the i-InGaAs absorbing layer 1003 is set to 0.5 μm, and the total thickness of the p-InP clad layer 1004 and the p-type contact layer 1005 is set to 1.0 μm.

By setting the thicknesses of the layers as described above, the i-InGaAsP core layer 1012 of the waveguide unit 1011 can be connected to a side face of the n-InGaAsP semiconductor layer 1002 of the photo-detector unit 1001. The i-InGaAsP core layer 1012 of the waveguide unit 1011 and the n-InGaAsP semiconductor layer 1002 of the photo-detector unit 1001 are connected adjacent to each other along the direction in which the i-InGaAsP core layer 1012 extends.

In the waveguide unit 1011, for example, the width of the mesa structure including the i-InGaAsP core layer 1012 and the i-InP clad layer 1013 (the width along the direction orthogonal to the direction in which the i-InGaAsP core layer 1012 extends) is 2.5 μm. In the photo-detector unit 1001, the width of the mesa structure including the i-InGaAs absorbing layer 1003, the p-InP clad layer 1004, and the p-type contact layer 1005 (the width along the direction orthogonal to the direction in which the i-InGaAsP core layer 1012 extends) is 5 μm, and the length (PD length) of the photo-detector unit 1001 is 10 μm.

The light receiving element 1000 having the above-mentioned structure can supply a detection signal with sufficient signal level to the subsequent electrical circuit also at high frequencies while improving the efficiency of light absorption in the photo-detector unit 1001. Further, the light receiving element 1000 can perform an output operation adapted to high intensity light input in which the intensity of the input signal light is high.

In the above-mentioned embodiment, as an example of the light receiving element 1000 with respect to a signal light having a wavelength of about 1.5 μm, a photodiode in which the i-InGaAs absorbing layer 1003 is made of InGaAs and layers such as a waveguide layer are made of an InGaAsP-based material is described. However, the embodiment is not limited to this. In the light receiving element 1000 according to the above-mentioned embodiment, the material of the i-InGaAs absorbing layer 1003 may be another material that absorbs light within the wavelength band of the incident signal light, and the material of other layers may be another material that does not absorb this light.

While the material of layers such as the i-InGaAs absorbing layer 1003 is an i-type semiconductor in the above example, for example, part or the whole of the material of the InGaAs absorbing layer 1003 may be a p-type or n-type semiconductor.

While in the above-mentioned embodiment a high-mesa structure is described as the waveguide structure in each of the waveguide unit 1011 and the photo-detector unit 1001, the waveguide structure may be such that part or the whole of the structure is formed as a buried waveguide.

[1-5. Manufacturing Method of the Light Receiving Element 1000]

FIGS. 13A to 17B are diagrams each illustrating an example of the manufacturing process of the light receiving element 1000 illustrated as FIGS. 10 to 12B. Of FIGS. 13A to 17B, FIGS. 13A, 14A, 15A, 16A, and 17A on the upper side are each a plan view as seen from above the corresponding substrate, illustrating the main portion of the light receiving element 1000. FIGS. 13B, 14B, 15B, 16B, and 17B on the lower side are cross-sectional views taken along broken lines XIIIB-XIIIB, XIVB-XIVB, XVB-XVB, XVIB-XVIB, and XVIIB-XVIIB in the plan views FIGS. 13A, 14A, 15A, 16A, and 17A, respectively, illustrating the vicinity of the boundary region between the photo-detector unit 1001 and the waveguide unit 1011. Hereinbelow, an example of the manufacturing method of the light receiving element 1000 is described with reference to FIGS. 13A to 17B.

Figure 13A:
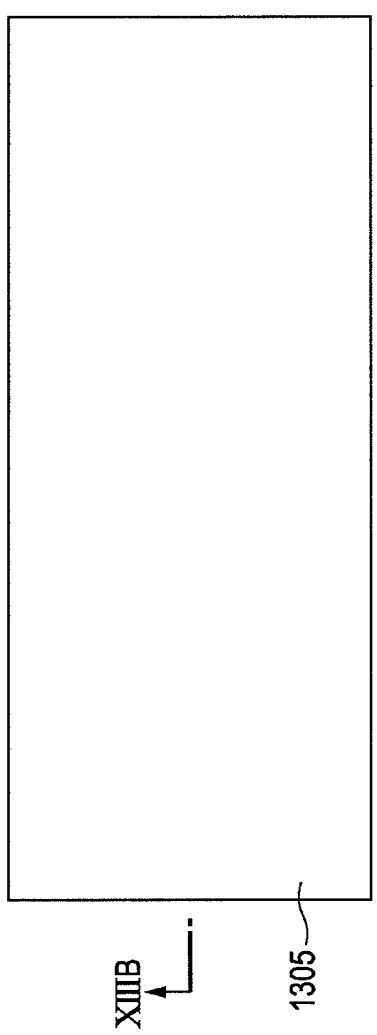
FIGS. 13A and 13B illustrate an example of the manufacturing process of the light receiving element illustrated as FIGS. 10 to 12B (Part 1)
Figure 13B:
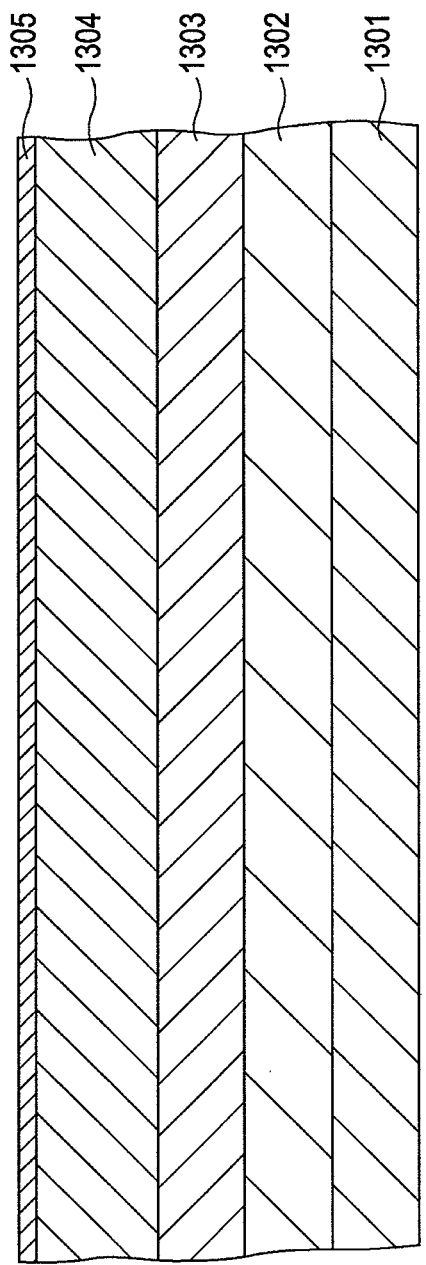

As illustrated as FIGS. 13A and 13B, over an SI-InP substrate 1301, an n-InGaAsP film 1302, an i-InGaAs film 1303, a p-InP film 1304, and a p-InGaAs/InGaAsP laminate film 1305 made up of two films of p-InGaAs and InGaAsP are deposited by, for example, the metal organic chemical vapor deposition (MOCVD) method. At this time, the deposition is performed so that the n-InGaAsP film 1302 has a thickness of 0.5 μm and the i-InGaAs film 1303 has a thickness of 0.5 μm. Also, the deposition is performed so that the total thickness of the p-InP film 1304 and the p-InGaAs/InGaAsP laminate film 1305 becomes 1.0 μm.

Next, a mask 1401 for covering a region that becomes the photo-detector unit 1001 illustrated as FIGS. 10 to 12B is formed over the p-InGaAs/InGaAsP laminate film 1305, thereby selectively exposing a region that becomes the waveguide unit 1011. As the mask 1401, for example, a silicon oxide film is used. By etching according to related art using the mask 1401, as illustrated as FIGS. 14A and 14B, the n-InGaAsP film 1302, the i-InGaAs film 1303, the p-InP film 1304, and the p-InGaAs/InGaAsP laminate film 1305 are left only in the photo-detector unit 1001, and these films are removed from the waveguide unit 1011. Through this processing, in the waveguide unit 1011, the SI-InP substrate 1301 is exposed.

Next, as illustrated as FIGS. 15A and 15B, over the SI-InP substrate 1301 from which the waveguide unit 1011 is exposed, an i-InGaAsP film 1501 and an i-InP film 1502 are deposited by selective growth according to related art using the MOCVD method. At this time, the deposition is performed so that the i-InGaAsP film 1501 has a thickness of 0.5 μm and the i-InP film 1502 has a thickness of 1.5 μm. Since the photo-detector unit 1001 is covered with the mask 1401 used in the above-mentioned etching, growth of the i-InGaAsP film 1501 and the i-InP film 1502 in the photo-detector unit 1001 can be inhibited. After depositing the i-InP film 1502, the mask 1401 is removed.

Next, a mask for covering a region that becomes a mesa structure in each of the photo-detector unit 1001 and the waveguide unit 1011 is formed over the p-InGaAs/InGaAsP laminate film 1305 and the i-InP film 1502. As the mask, for example, a silicon oxide film is used. By etching according to related art using this mask, a mesa structure is formed in each of the photo-detector unit 1001 and the waveguide unit 1011. After the etching, the mask is removed.

Figure 16A:
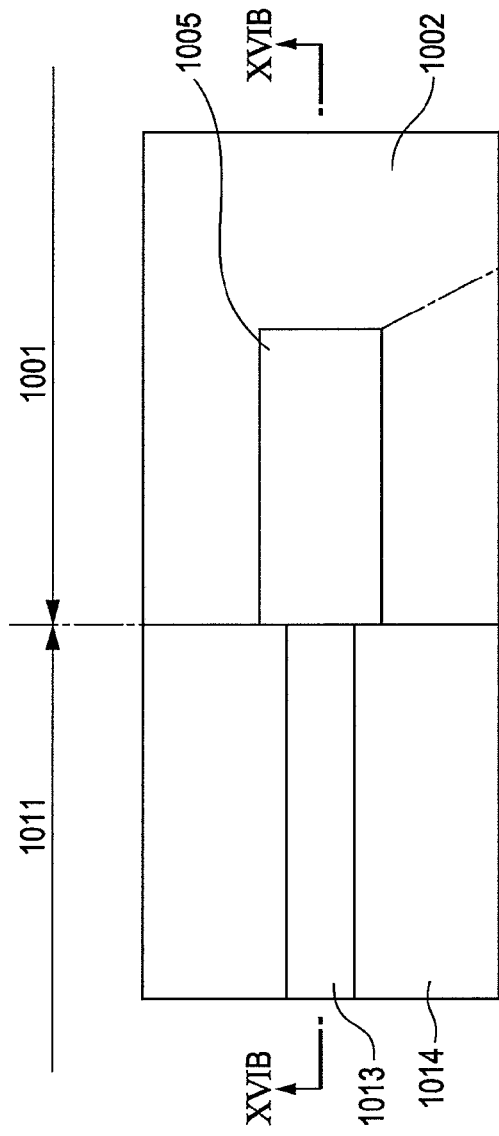
FIGS. 16A and 16B illustrate an example of the manufacturing process of the light receiving element illustrated as FIGS. 10 to 12B (Part 4)
Figure 16B:
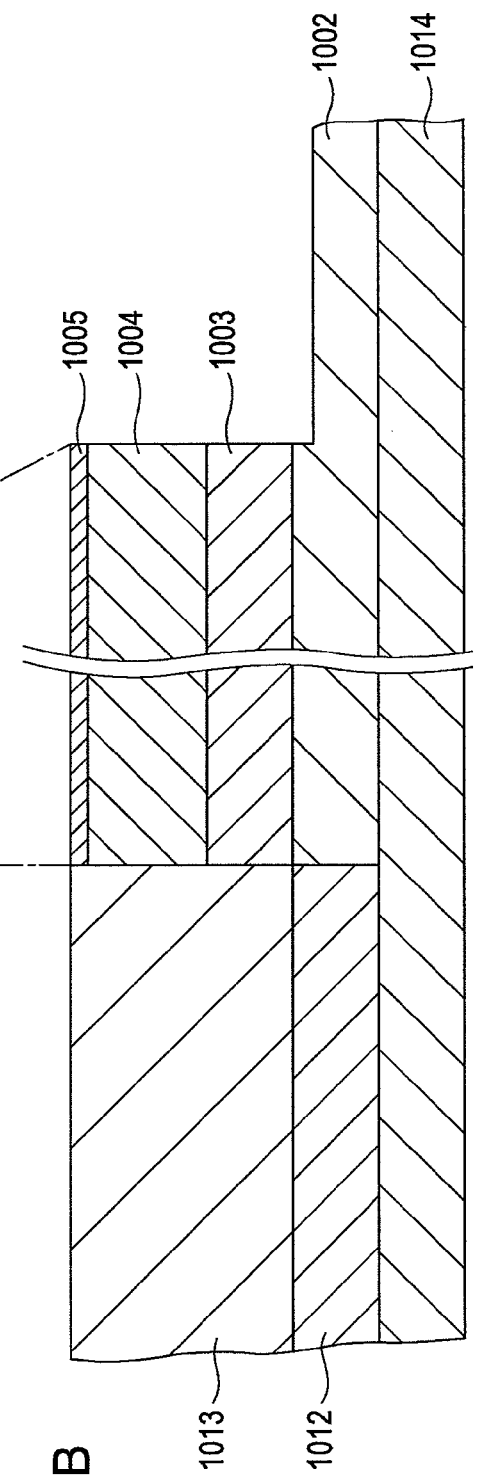

At this time, as illustrated as FIGS. 16A and 16B, in the photo-detector unit 1001, the above-mentioned mask is used to remove the p-InGaAs/InGaAsP laminate film 1305, the p-InP film 1304, and the i-InGaAs film 1303, and the n-InGaAsP film 1302 is removed half way through its depth so as to leave part of the n-InGaAsP film 1302. Through this processing, part of the n-InGaAsP film 1302 is exposed. Thus, the mesa structure illustrated as FIGS. 10 to 12B is formed, which includes part of the n-InGaAsP semiconductor layer 1002, the i-InGaAs absorbing layer 1003, the p-InP clad layer 1004, and the p-type contact layer 1005.

As illustrated as FIGS. 16A and 16B, in the waveguide unit 1011, the above-mentioned mask is used to remove the i-InP film 1502 and the i-InGaAsP film 1501, and part of the SI-InP substrate 1301 located below the i-InGaAsP film 1501 is also removed. Through this processing, part of the SI-InP substrate 1301 is exposed. Thus, the mesa structure illustrated as FIGS. 10 to 12B which includes the i-InGaAsP core layer 1012 and the i-InP clad layer 1013 is formed.

Next, in the photo-detector unit 1001 and the waveguide unit 1011, the passivation film 1017 made of a dielectric such as a silicon nitride film is formed, except for regions where electrodes are to be formed. Thereafter, as illustrated as FIGS. 17A and 17B, in the photo-detector unit 1001, the p-side electrode 1015 is formed in a region at the top of the mesa structure where the p-type contact layer 1005 is exposed, by a method according to related art such as metal deposition or plating. Also, the n-side electrode 1016 is formed in a region where the n-InGaAsP semiconductor layer 1002 is exposed, by a method according to related art such as metal deposition or plating. In the plan view of FIG. 17A, the passivation film 1017 is not illustrated for the sake of facilitating understanding of the structure.

Figure 17A:
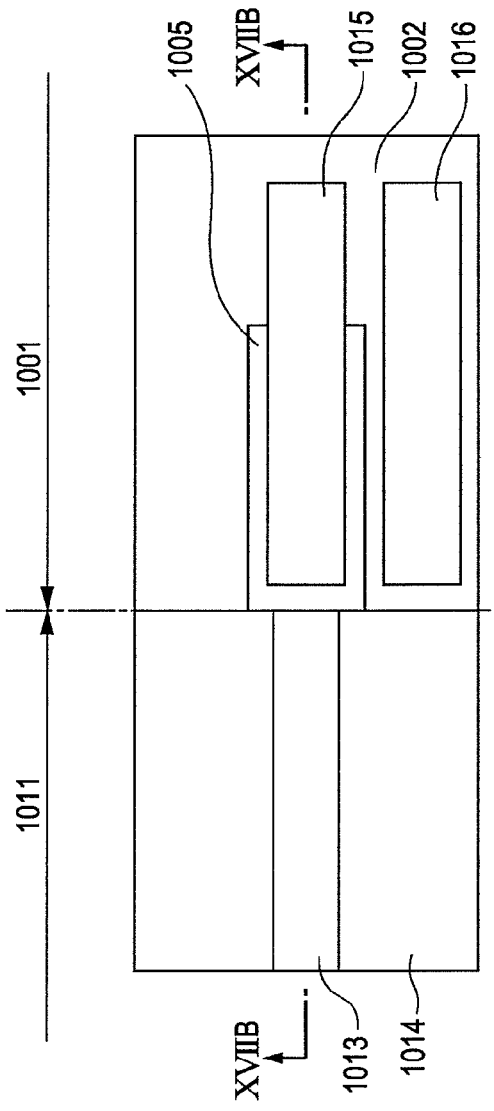
FIGS. 17A and 17B illustrate an example of the manufacturing process of the light receiving element illustrated as FIGS. 10 to 12B (Part 5)
Figure 17B:
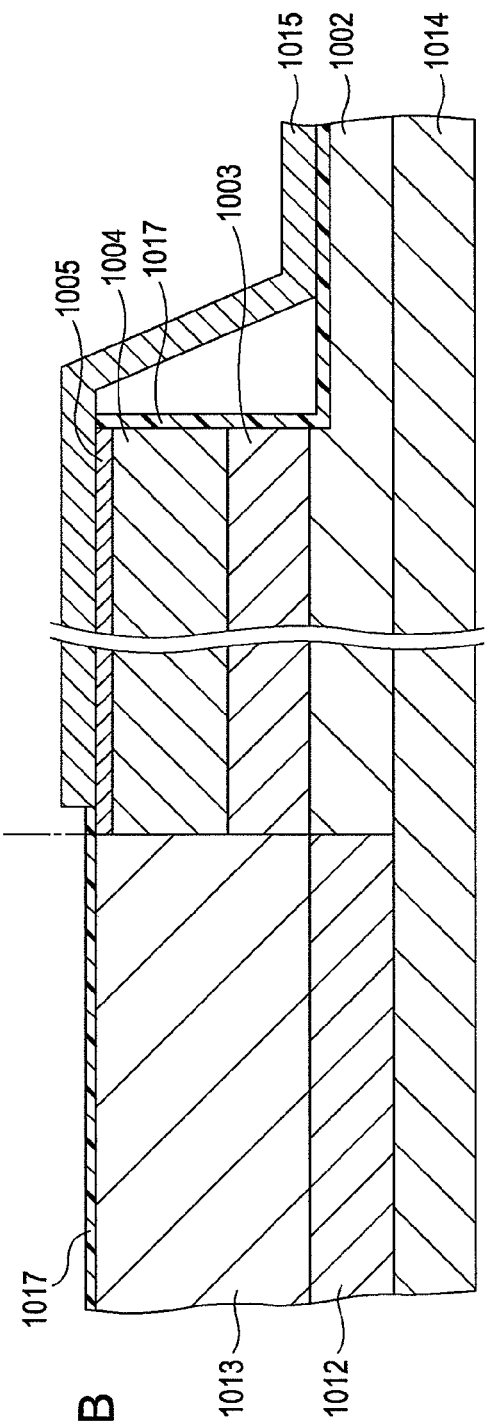

In FIGS. 17A and 17B, an electrode having an air bridge structure is used as the p-side electrode 1015. As is apparent from the cross-sectional view of FIG. 17B, due to this structure, the p-side electrode 1015, and the n-InGaAsP semiconductor layer 1002 to which the n-side electrode 1016 is connected are electrically insulated by air.

Thus, parasitic capacitance occurring between the p-side electrode 1015 and the n-side electrode 1016 can be reduced. Therefore, capacitance of the photo-detector unit 1001 can be made further smaller. Thus, the light receiving element 1000 can supply a detection signal with sufficient signal level to the subsequent electrical circuit also at further higher frequencies.

However, the structure of the p-side electrode 1015 is not limited to an air bridge structure. An insulator may be formed in advance at the location where the p-side electrode 1015 is to be formed, and the p-side electrode 1015 may be formed over the insulator. In FIGS. 17A and 17B, the n-InGaAsP semiconductor layer 1002 partially remains in the portion of the PD opposite to the waveguide unit 1011, and the p-side electrode 1015 is formed over the n-InGaAsP semiconductor layer 1002 via the passivation film 1017. However, it is also possible to remove the n-InGaAsP semiconductor layer 1002 in the portion of the PD opposite to the waveguide unit 1011. This makes it possible to reduce the capacitance of the p-side electrode 1015, and also further improve characteristics at high frequencies.

Although not illustrated in FIGS. 15A and 15B, in actuality, there are cases when the i-InGaAsP film 1501 is deposited with a small thickness also on the side wall portion of the photo-detector unit 1001 exposed by etching illustrated as FIGS. 14A and 14B. However, the film deposited on the side wall portion of the photo-detector unit 1001 is sufficiently thin in comparison to the i-InGaAsP core layer 1012, and also the refractive index of the film deposited on the side wall portion is the same as the refractive index of the i-InGaAsP core layer 1012. Thus, this film does not affect signal light propagation.

[2. Second Embodiment]

Figure 18:
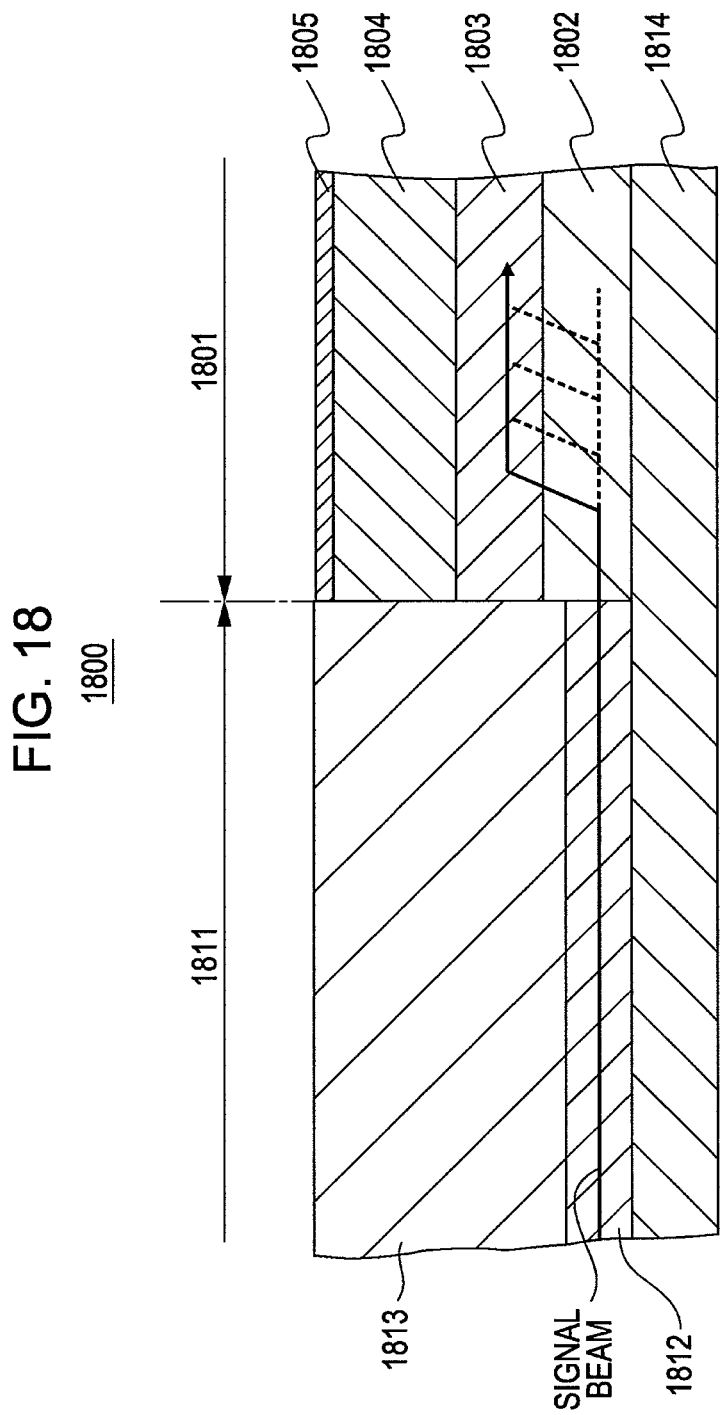
FIG. 18 is a cross-sectional view illustrating an example of the structure of a light receiving element according to a second embodiment.

FIG. 18 illustrates an example of the structure of a light receiving element 1800 according to a second embodiment. FIG. 18 illustrates a cross-section corresponding to the cross-section of the light receiving element 600 according to the first embodiment illustrated as FIG. 7. The light receiving element 1800 illustrated as FIG. 18 differs from the light receiving element 600 illustrated as FIG. 6 in the thickness of the core but is otherwise the same. Since a perspective view of the light receiving element 1800 is the same as the perspective view of the light receiving element 600 illustrated as FIG. 6 except for the thickness of the core, the perspective view is not illustrated.

As illustrated as FIG. 18, the light receiving element 1800 includes a photo-detector unit 1801 provided over a substrate 1814, and a waveguide unit 1811 provided over the same substrate 1814.

The waveguide unit 1811 has a structure in which a core 1812 and an upper clad layer 1813 are laminated from the substrate 1814 side. The material of each of the layers of this laminate structure is, for example, a semiconductor. The waveguide unit 1811 has a mesa structure including the upper clad layer 1813 and the core 1812. A signal light propagates in the core 1812, and enters the photo-detector unit 1801.

The photo-detector unit 1801 has a structure in which an n-type semiconductor layer 1802, an i-type absorbing layer 1803, a p-type upper clad layer 1804, and a p-type contact layer 1805 are laminated from the substrate 1814 side. The material of each of the layers of this laminate structure is, for example, a semiconductor. The photo-detector unit 1801 has a mesa structure including the p-type contact layer 1805, the p-type upper clad layer 1804, the i-type absorbing layer 1803, and part of the n-type semiconductor layer 1802. The n-type semiconductor layer 1802, the i-type absorbing layer 1803, and the p-type upper clad layer 1804 form a PIN-type photodiode.

As illustrated as FIG. 18, in the light receiving element 1800, the core 1812 is connected to a side face of the n-type semiconductor layer 1802, and the core 1812 and the n-type semiconductor layer 1802 are connected adjacent to each other along the direction in which the core 1812 extends. The core 1812 is so formed that its top face is located higher than the bottom face of the n-type semiconductor layer 1802 (located farther away from the substrate 1814), and its bottom face is located lower than the top face of the n-type semiconductor layer 1802 (located closer to the substrate 1814).

The n-type semiconductor layer 1802 is so formed that its refractive index is higher than the refractive index of the core 1812, and lower than the refractive index of the i-type absorbing layer 1803. That is, the n-type semiconductor layer 1802 is so formed that its bandgap wavelength is longer than the bandgap wavelength of the core 1812, and shorter than the bandgap wavelength of the i-type absorbing layer 1803. The n-type semiconductor layer 1802 is formed so as to have a composition that makes the absorption coefficient for the signal light sufficiently small.

Further, as illustrated as FIG. 18, in the light receiving element 1800, the core 1812 is so formed that its top face is located lower than the top face of the n-type semiconductor layer 1802 (located closer to the substrate 1814). The bottom face of the core 1812 is flush with the bottom face of the n-type semiconductor layer 1802. The structure illustrated as FIG. 18 can be formed by, for example, making the thickness of the core 1812 smaller than the thickness of the n-type semiconductor layer 1802.

As illustrated as FIG. 18, in the light receiving element 1800, the signal light propagates in the core 1812 in the waveguide unit 1811, and enters the n-type semiconductor layer 1802 in the photo-detector unit 1801. The n-type semiconductor layer 1802 receives the signal light from the core 1812 along the direction in which the core 1812 extends. Since the refractive index of the n-type semiconductor layer 1802 is set higher than the refractive index of the core 1812, the loss at the time when the signal light enters the n-type semiconductor layer 1802 from the core 1812 can be reduced. Part of the incident signal light seeps out from the n-type semiconductor layer 1802 into the i-type absorbing layer 1803, and is absorbed in the i-type absorbing layer 1803.

In the photo-detector unit 1801, unlike in the photo-detector unit 101 of the light receiving element 100 illustrated as FIGS. 1 and 2, the signal light enters the n-type semiconductor layer 1802 which is directly in contact with the i-type absorbing layer 1803 in which absorption of the signal light takes place. Consequently, as soon as the signal light enters the n-type semiconductor layer 1802, the signal light seeps out into the i-type absorbing layer 1803, and its absorption begins. Consequently, in the photo-detector unit 1801, the PD length can be made shorter than the PD length of the photo-detector unit 101 in the light receiving element 100 while ensuring sufficient light absorption efficiency.

Because the PD length of the photo-detector unit 1801 can be shortened, capacitance of the photo-detector unit 1801 can be reduced. Consequently, the light receiving element 1800 can supply a detection signal with sufficient signal level to the subsequent electrical circuit also at high frequencies, making it possible for the subsequent electrical circuit to process an input signal also at high frequencies.

In addition, in the light receiving element 1800, unlike in the photo-detector unit 301 of the light receiving element 300 illustrated as FIGS. 3 and 4, the signal light does not directly enter the i-type absorbing layer 1803 but enters the n-type semiconductor layer 1802 first, and then its components seeping out into the i-type absorbing layer 1803 are absorbed. Consequently, in the photo-detector unit 1801, the overall density distribution of generated photocarriers is a flat, gently sloping distribution in comparison to that in the photo-detector unit 301.

Consequently, in the photo-detector unit 1801, an excessive increase in local photocarrier density can be reduced even in the case of high intensity light input where the intensity of the inputted signal light is high. Thus, it is possible to reduce deterioration of high frequency property for high intensity signal light.

Further, in the light receiving element 1800, unlike in the light receiving element 600 illustrated as FIG. 7, the top face of the core 1812 is located lower than the top face of the n-type semiconductor layer 1802. Consequently, in the light receiving element 1800, as compared with the light receiving element 600, seeping out of the signal light into the i-type absorbing layer 1803 becomes smaller by an amount of the difference between the top face of the core 1812 and the top face of the n-type semiconductor layer 1802. That is, absorption per unit length in the i-type absorbing layer 1803 becomes smaller than in the case of the light receiving element 600, and the propagation distance of the signal light over which sufficient absorption takes place becomes longer than in the case of the light receiving element 600.

Consequently, the peak of the photocarrier density distribution in the photo-detector unit 1801 of the light receiving element 1800 occurs at a location farther away from the end of the photo-detector unit 1801 from which the signal light enters, than the peak in the case of the photo-detector unit 601. Accordingly, in the light receiving element 1800, the overall density distribution of generated photocarriers spreads to a location farther away from the end of the photo-detector unit 1801, and thus becomes a more flat, gently sloping distribution as compared with the distribution in the case of the light receiving element 600. The value of density at the peak location of the photocarrier density distribution becomes small in comparison to the value of density at the peak location in the case of the light receiving element 600.

Accordingly, as compared with the photo-detector unit 601, in the photo-detector unit 1801 of the light receiving element 1800, an excessive increase in local photocarrier density can be reduced more also when a signal light with higher intensity is inputted. Consequently, in the photo-detector unit 1801, deterioration of high frequency property for high intensity signal light can be reduced. Thus, in the light receiving element 1800, it is possible to perform an output operation adapted to input of a signal light with higher intensity, in comparison to the light receiving element 600.

As has been described above, in the light receiving element 1800 according to the second embodiment, a detection signal with sufficient signal level can be supplied to the subsequent electrical circuit also at high frequencies while improving the efficiency of light absorption in the photo-detector unit 1801. Further, the light receiving element 1800 can perform an output operation adapted to high intensity light input in which the intensity of the input signal light is high.

Further, as compared with the light receiving element 600 according to the first embodiment, the light receiving element 1800 according to the second embodiment can be also adapted to input of a signal light with higher intensity. For example, the light receiving element 1800 according to the second embodiment is effectively applied to a light receiving element, a light receiving device, and a light receiving module that process a signal light with higher intensity, and a system using these light receiving element, light receiving device, and light receiving module.

As a specific example of the structure of the light receiving element 1800 according to the second embodiment, the configuration described above as a specific example of the structure of the light receiving element 600 according to the first embodiment can be used. However, as mentioned above, the core 1812 is so formed that its thickness is smaller than the thickness of the n-type semiconductor layer 1802.

As for the manufacturing method of the light receiving element 1800 as well, the method described above as the manufacturing method of the light receiving element 600 can be used.

[3. Third Embodiment]

[3-1. Structure of a Light Receiving Element 1900]

Figure 19:
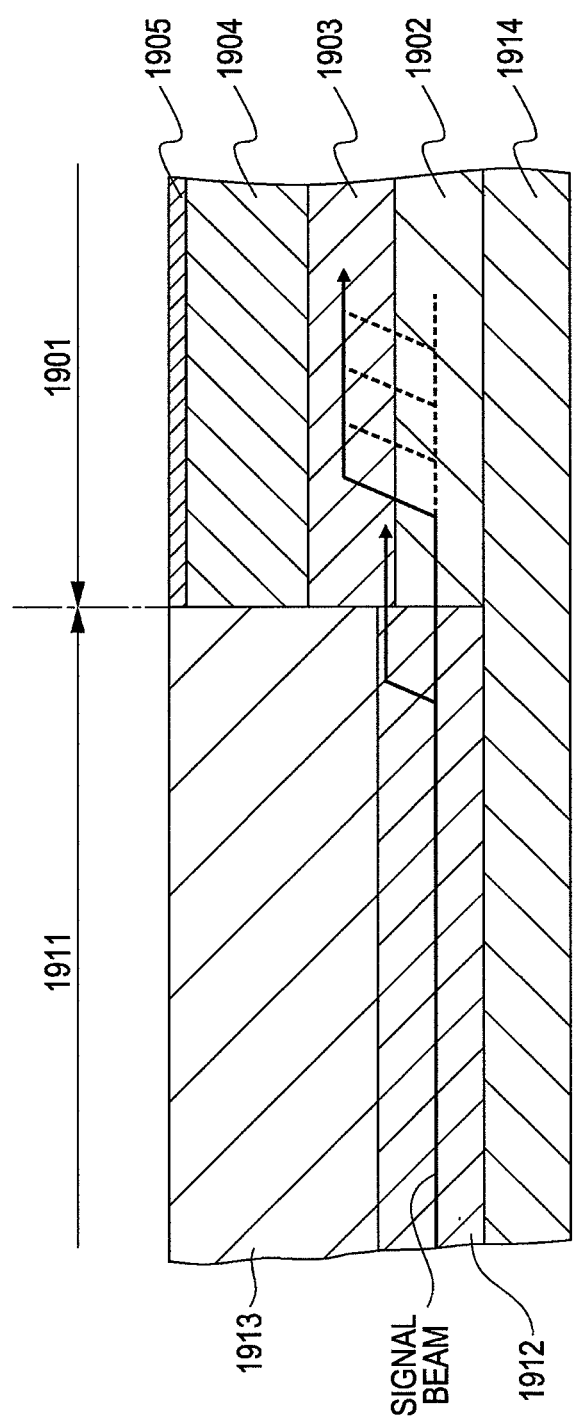
FIG. 19 is a cross-sectional view illustrating an example of the structure of a light receiving element according to a third embodiment.

FIG. 19 illustrates an example of the structure of a light receiving element 1900 according to a third embodiment. FIG. 19 illustrates a cross-section corresponding to the cross-section of the light receiving element 600 according to the first embodiment illustrated as FIG. 7. The light receiving element 1900 illustrated as FIG. 19 differs from the light receiving element 600 illustrated as FIG. 6 in the thickness of the core but is otherwise the same. Since a perspective view of the light receiving element 1900 is the same as the perspective view of the light receiving element 600 illustrated as FIG. 6 except for the thickness of the core, the perspective view is not illustrated.

As illustrated as FIG. 19, the light receiving element 1900 includes a photo-detector unit 1901 provided over a substrate 1914, and a waveguide unit 1911 provided over the same substrate 1914.

The waveguide unit 1911 has a structure in which a core 1912 and an upper clad layer 1913 are laminated from the substrate 1914 side. The material of each of the layers of this laminate structure is, for example, a semiconductor. The waveguide unit 1911 has a mesa structure including the upper clad layer 1913 and the core 1912. A signal light is made to propagate in the core 1912, and enter the photo-detector unit 1901.

The photo-detector unit 1901 has a structure in which an n-type semiconductor layer 1902, an i-type absorbing layer 1903, a p-type upper clad layer 1904, and a p-type contact layer 1905 are laminated from the substrate 1914 side. The material of each of the layers of this laminate structure is, for example, a semiconductor. The photo-detector unit 1901 has a mesa structure including the p-type contact layer 1905, the p-type upper clad layer 1904, the i-type absorbing layer 1903, and part of the n-type semiconductor layer 1902. The n-type semiconductor layer 1902, the i-type absorbing layer 1903, and the p-type upper clad layer 1904 form a PIN-type photo-diode.

In the light receiving element 1900 illustrated as FIG. 19, the core 1912 is connected to side faces of the n-type semiconductor layer 1902 and i-type absorbing layer 1903. The core 1912, and the n-type semiconductor layer 1902 and the i-type absorbing layer 1903 are connected adjacent to each other along the direction in which the core 1912 extends. The core 1912 is so formed that its top face is located higher than the bottom face of the n-type semiconductor layer 1902 (located farther away from the substrate 1914), and its bottom face is located lower than the top face of the n-type semiconductor layer 1902 (located closer to the substrate 1914).

The n-type semiconductor layer 1902 is so formed that its refractive index is higher than the refractive index of the core 1912, and lower than the refractive index of the i-type absorbing layer 1903. That is, the n-type semiconductor layer 1902 is so formed that its bandgap wavelength is longer than the bandgap wavelength of the core 1912, and shorter than the bandgap wavelength of the i-type absorbing layer 1903. The n-type semiconductor layer 1902 is formed so as to have a composition that makes the absorption coefficient for the signal light sufficiently small.

Further, as illustrated as FIG. 19, in the light receiving element 1900, the core 1912 is so formed that its top face is located higher than the top face of the n-type semiconductor layer 1902 (located farther away from the substrate 1914), and lower than the top face of the i-type absorbing layer 1903 (located closer to the substrate 1914). The bottom face of the core 1912 is flush with the bottom face of the n-type semiconductor layer 1902. The structure illustrated as FIG. 19 can be formed by, for example, making the thickness of the core 1912 larger than the thickness of the n-type semiconductor layer 1902.

However, it is preferable that the thickness of the n-type semiconductor layer 1902 be not less than half the thickness of the core 1912. That is, it is preferable that the thickness of the portion of the core 1912 connected to the i-type absorbing layer 1903 be not more than half the entire thickness of the core 1912. Also, it is preferable that half or more portion of the core 1912 with respect to the thickness direction be located lower than the top face of the n-type semiconductor layer 1902 (located closer to the substrate 1914). Also, it is preferable that the thickness of the core 1912 be smaller than the sum of the thickness of the i-type absorbing layer 1903 and the thickness of the n-type semiconductor layer 1902. This is to ensure that as compared with direct entry of the signal light into the i-type absorbing layer 1903, light absorption in the photo-detector unit 1901 is performed substantially equally or predominantly by seeping out of the signal light from the n-type semiconductor layer 1902 into the i-type absorbing layer 1903, so that the value of photocarrier density near the end of the photo-detector unit 1901 does not become excessively large. Details in this regard are given later.

As illustrated as FIG. 19, in the light receiving element 1900, the signal light propagates in the core 1912 in the waveguide unit 1911, and in the photo-detector unit 1901, the majority of the signal light enters the n-type semiconductor layer 1902, and the remainder of the signal light directly enters the i-type absorbing layer 1903. The n-type semiconductor layer 1902 and the i-type absorbing layer 1903 receive the signal light from the core 1912 along the direction in which the core 1912 extends. Since the refractive indexes of the n-type semiconductor layer 1902 and i-type absorbing layer 1903 are set higher than the refractive index of the core 1912, the loss at the time when the signal light enters the n-type semiconductor layer 1902 and the i-type absorbing layer 1903 from the core 1912 can be reduced. Part of the signal light having entered the n-type semiconductor layer 1902 seeps out from the n-type semiconductor layer 1902 into the i-type absorbing layer 1903, and is absorbed in the i-type absorbing layer 1903. The signal light having entered the i-type absorbing layer 1903 is absorbed as it is in the region near the end of the i-type absorbing layer 1903 through which the signal light enters.

In the photo-detector unit 1901, unlike in the photo-detector unit 101 of the light receiving element 100 illustrated as FIGS. 1 and 2, the majority of the signal light enters the n-type semiconductor layer 1902 which is directly in contact with the i-type absorbing layer 1903 in which absorption of the signal light takes place. Consequently, as soon as the signal light enters the n-type semiconductor layer 1902, the majority of the signal light seeps out into the i-type absorbing layer 1903, and absorption of the signal light begins immediately after the entry. Consequently, in the photo-detector unit 1901, the PD length can be made shorter than the PD length of the photo-detector unit 101 in the light receiving element 100 while ensuring sufficient light absorption efficiency.

Because the PD length of the photo-detector unit 1901 can be shortened, capacitance of the photo-detector unit 1901 can be reduced. Consequently, the light receiving element 1900 can supply a detection signal with sufficient signal level to the subsequent electrical circuit also at high frequencies. This makes it possible for the subsequent electrical circuit to process an input signal also at high frequencies.

In addition, in the light receiving element 1900, unlike in the light receiving element 600 illustrated as FIG. 7, part of the signal light directly enters the i-type absorbing layer 1903. Since absorption of the incident signal light takes place in the region near the end of the i-type absorbing layer 1903 from which the signal light enters, the value of photocarrier density near the end of the photo-detector unit 1901 can be increased. Thus, in the light receiving element 1900, the efficiency of light absorption in the photo-detector unit 1901 can be further improved as compared with the photo-detector unit 601. Accordingly, as compared with the light receiving element 600, the light receiving element 1900 can be also adapted to input of a signal light with lower intensity without increasing the PD length.

Also, in the light receiving element 1900, the further improvement in light absorption efficiency makes it possible to further shorten the PD length of the photo-detector unit 1901 as compared with the light receiving element 600. Further shortening of the PD length enables a further reduction in capacitance of the photo-detector unit 1901. Consequently, the light receiving element 1900 can supply a detection signal with sufficient signal level to the subsequent electrical circuit also at further higher frequencies. This makes it possible for the subsequent electrical circuit to process an input signal also at further higher frequencies.

On the other hand, in the light receiving element 1900, unlike in the photo-detector unit 301 of the light receiving element 300 illustrated as FIG. 4, only part of the signal light directly enters the i-type absorbing layer 1903. Consequently, the value of photocarrier density does not become excessively large near the end of the photo-detector unit 1901 from which the signal light enters. Consequently, in the photo-detector unit 1901, an excessive increase in local photocarrier density can be reduced even in the case of high intensity light input where the intensity of the inputted signal light is high. Thus, in the light receiving element 1900, it is possible to reduce deterioration of high frequency property for high intensity signal light.

As has been described above, in the light receiving element 1900 according to the third embodiment, a detection signal with sufficient signal level can be supplied to the subsequent electrical circuit also at high frequencies while improving the efficiency of light absorption in the photo-detector unit 1901. Further, the light receiving element 1900 can perform an output operation adapted to high intensity light input in which the intensity of the input signal light is high.

Further, in the light receiving element 1900 according to the third embodiment, the efficiency of light absorption can be further improved as compared with the light receiving element 600 according to the first embodiment. Thus, the light receiving element 1900 can be also adapted to detection of a signal light with lower intensity without increasing the PD length. Also, the light receiving element 1900 can supply a detection signal with sufficient signal level to the subsequent electrical circuit also at further higher frequencies.

For example, the light receiving element 1900 according to the third embodiment is effectively applied to a light receiving element, a light receiving device, and a light receiving module that process a signal light with lower intensity, and a system using these light receiving element, light receiving device, and light receiving module. Also, the light receiving element 1900 according to the third embodiment is effectively applied to a light receiving element, a light receiving device, and a light receiving module for which an electrical circuit operating at higher operating frequency is arranged in the subsequent stage, and a system using these light receiving element, light receiving device, and light receiving module.

As a specific example of the structure of the light receiving element 1900 according to the third embodiment, the configuration described above as a specific example of the structure of the light receiving element 600 according to the first embodiment can be used. However, as mentioned above, the core 1912 is so formed that its thickness is larger than the thickness of the n-type semiconductor layer 1902.

As for the manufacturing method of the light receiving element 1900 as well, the method described above as the manufacturing method of the light receiving element 600 can be used.

[3-2. Photocarrier Density Distribution in the Photo-detector Unit 1901]

Figure 20:
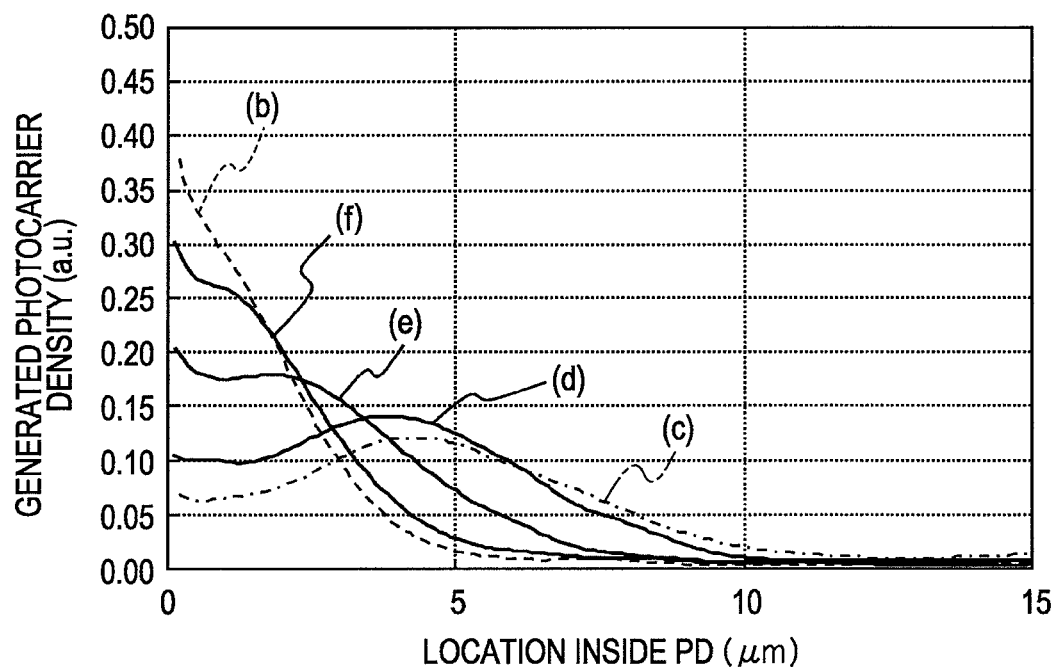
FIG. 20 illustrates an example of the simulated density distribution of photocarriers generated in a photo-detector unit of a light receiving element.

FIG. 20 illustrates an example of the simulated density distribution of photocarriers generated in the photo-detector unit 1901 of the light receiving element 1900. The vertical axis represents the density of photocarriers as normalized on the basis of a predetermined value. The horizontal axis represents location inside the PD in the photo-detector unit 1901.

In FIG. 20, the curves indicated by (d) to (f) represent photocarrier density distributions in the photo-detector unit 1901 of the light receiving element 1900 illustrated as FIG. 19. The distribution curve indicated by (d) represents the distribution in a case where the thickness of the portion of the core 1912 connected to the i-type absorbing layer 1903 is set to 25% of the entire thickness of the core 1912. The distribution curve indicated by (e) represents the distribution in a case where the thickness of the portion of the core 1912 connected to the i-type absorbing layer 1903 is set to 50% of the entire thickness of the core 1912. The distribution curve indicated by (f) represents the distribution in a case where the thickness of the portion of the core 1912 connected to the i-type absorbing layer 1903 is set to 75% of the entire thickness of the core 1912.

In FIG. 20, for the sake of comparison, a photocarrier density distribution curve (b) for the photo-detector unit 301 of the light receiving element 300 illustrated as FIG. 3 is indicated by a broken line, and a photocarrier density distribution curve (c) for the photo-detector unit 601 of the light receiving element 600 illustrated as FIG. 6 is indicated by an alternate long and short dash line. The photocarrier density distribution curve (b) corresponds to a case where the thickness of the portion of the core 1912 connected to the i-type absorbing layer 1903 is set to 100% of the entire thickness of the core 1912, and the photocarrier density distribution curve (c) corresponds to a case where the thickness of the portion of the core 1912 connected to the i-type absorbing layer 1903 is set to 0% of the entire thickness of the core 1912.

[3-2-1. Comparison Between Cases Differing in the Thickness of the Portion of the Core 1912 Connected to the i-Type Absorbing Layer 1913]

Photocarrier density distribution in the photo-detector unit 1901 is compared between cases that differ in the thickness of the portion of the core 1913 connected to the i-type absorbing layer 1913.

As represented by the distribution curve (d) in FIG. 20, in the case where the thickness of the portion of the core 1912 connected to the i-type absorbing layer 1903 is set to 25% of the entire thickness of the core 1912, the peak of the photocarrier density distribution occurs at a location separated by a predetermined distance from the end of the photo-detector unit 1901 from which the signal light enters.

In the distribution curve (d), the value of density at the peak location of the photocarrier density distribution is sufficiently small in comparison to the maximum value (the density near the end of the photo-detector unit 1901) in the case of the distribution curve (b) (light receiving element 300). Also, the overall density distribution is a flat, gently sloping distribution as compared with the distribution curve (b) (light receiving element 300).

That is, the distribution curve (d) has characteristics more similar to the distribution curve (c) (light receiving element 600) than the distribution curve (b) (light receiving element 300). Consequently, in this case, it is considered that as in the case of the distribution curve (c) (light receiving element 600), light absorption in the photo-detector unit 1901 is performed predominantly by seeping out of the signal light from the n-type semiconductor layer 1902 into the i-type absorbing layer 1903, rather than by direct entry of the signal light into the i-type absorbing layer 1903.

On the other hand, as represented by the distribution curve (f) in FIG. 20, in the case where the thickness of the portion of the core 1912 connected to the i-type absorbing layer 1903 is set to 75% of the entire thickness of the core 1912, the maximum value of the photocarrier density distribution occurs at the end of the photo-detector unit 1901 from which the signal light enters, and the photocarrier density distribution is concentrated near the end. Consequently, although lower than that of the distribution curve (b) (light receiving element 300), the photocarrier density is still high.

That is, the distribution curve (f) has characteristics more similar to the distribution curve (b) (light receiving element 300) than the distribution curve (c) (light receiving element 600). Consequently, in this case, it is considered that as in the case of the distribution curve (b) (light receiving element 300), light absorption in the photo-detector unit 1901 is performed predominantly by direct entry of the signal light into the i-type absorbing layer 1903, rather than by seeping out of the signal light from the n-type semiconductor layer 1902 into the i-type absorbing layer 1903.

In contrast, as represented by the distribution curve (e) in FIG. 20, in the case where the thickness of the portion of the core 1912 connected to the i-type absorbing layer 1903 is set to 50% of the entire thickness of the core 1912, a small peak appears in the photocarrier density distribution at a location separated by a predetermined distance from the end of the photo-detector unit 1901, and a somewhat high photocarrier density is observed in the region near the end of the photo-detector unit 1901.

In the case of the distribution curve (e), unlike the distribution curve (b) (light receiving element 300) or the above-mentioned distribution curve (f), the photocarrier density distribution has a relatively flat shape from the end of the photo-detector unit 1901. As a result, in the case of the distribution curve (e), the maximum value of photocarrier density is lowered to roughly half the maximum value (the density near the end of the photo-detector unit 301) in the case of the distribution curve (b) (light receiving element 300).

That is, the distribution curve (e) has characteristics roughly intermediate between those of the distribution curve (c) (light receiving element 600) and distribution curve (b) (light receiving element 300). Consequently, it is considered that in this case, the ratio of contribution to light absorption in the photo-detector unit 1902 is substantially equal between seeping out of the signal light from the n-type semiconductor layer 1902 into the i-type absorbing layer 1903 and direct entry of the signal light into the i-type absorbing layer 1903.

It is appreciated from the above that the thickness of the portion of the core 1912 connected to the i-type absorbing layer 1903 is preferably not larger than half the entire thickness of the core 1912. This makes it possible to ensure that light absorption in the photo-detector unit 1901 is performed substantially equally or predominantly by seeping out of the signal light from the n-type semiconductor layer 1902 into the i-type absorbing layer 1903, in comparison to direct entry of the signal light into the i-type absorbing layer 1903. Thus, an excessive increase in local photocarrier density can be reduced even in the case of high intensity light input where the intensity of the inputted signal light is high.

[3-2-2. Comparison with the Light Receiving Element 600 (Density Distribution (c))]

Next, photocarrier density distribution in the photo-detector unit 1901, 601 is compared between the light receiving element 1900 and the light receiving element 600, with respect to a case where the thickness of the portion of the core 1912 connected to the i-type absorbing layer 1903 is set to 25% of the entire thickness of the core 1912 (density distribution (d) in FIG. 20).

In the case of the distribution curve (d) in FIG. 20, as compared with the distribution curve (c) (light receiving element 600), the peak of the photocarrier density distribution is located closer to the end of the photo-detector unit 1901 from which the signal light enters. Accordingly, the overall photocarrier density distribution is also shifted to the side closer to the end of the photo-detector unit 1901, and the spread of the distribution as a whole is also small.

Thus, in the light receiving element 1900, the efficiency of light absorption can be further improved as compared with the light receiving element 600. Thus, the light receiving element 1900 can be also adapted to detection of a signal light with lower intensity without increasing the PD length.

Also, in the light receiving element 1900, the further improvement in light absorption efficiency makes it possible to further shorten the PD length of the photo-detector unit 1901 as compared with the light receiving element 600. Further shortening of the PD length enables a further reduction in capacitance of the photo-detector unit 1901. Consequently, the light receiving element 1900 can supply a detection signal with sufficient signal level to the subsequent electrical circuit also at further higher frequencies.

As has been described above, in the light receiving element 1900 according to the third embodiment, the efficiency of light absorption can be further improved as compared with the light receiving element 600 according to the first embodiment. Thus, the light receiving element 1900 can be also adapted to detection of a signal light with lower intensity without increasing the PD length. Also, the light receiving element 1900 can supply a detection signal with sufficient signal level to the subsequent electrical circuit also at further higher frequencies.

[4. Fourth Embodiment]

Figure 21:
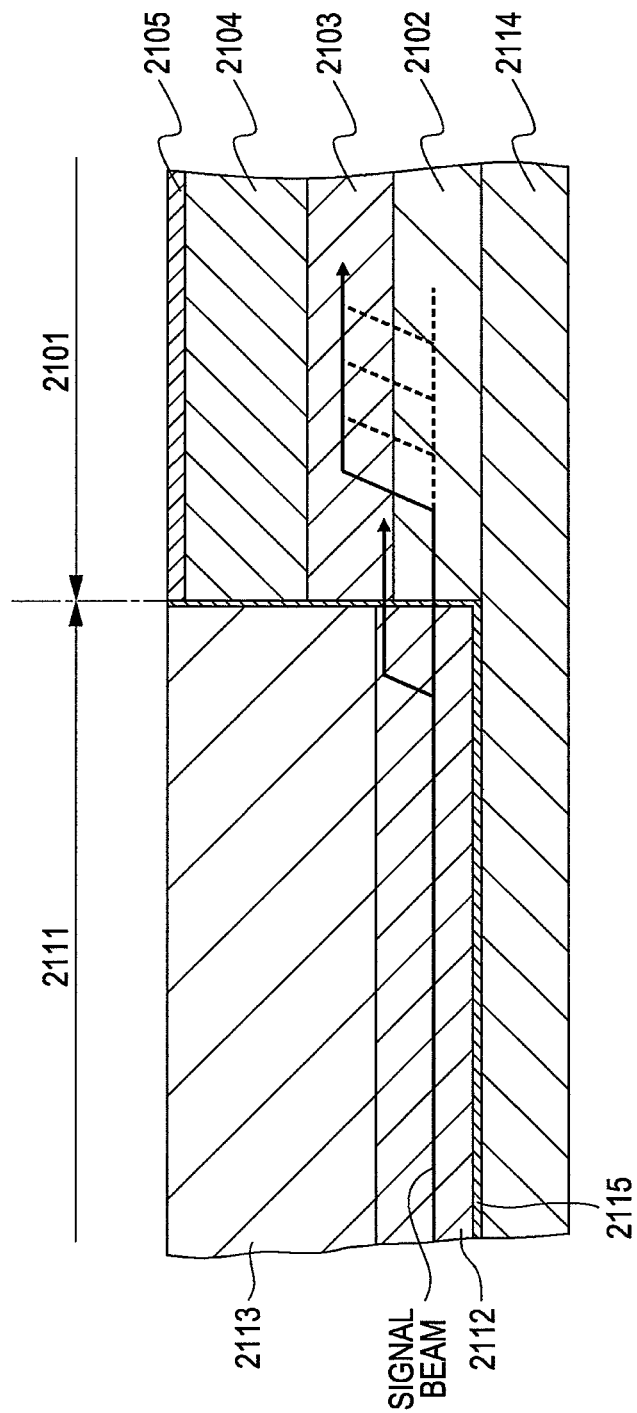
FIG. 21 is a cross-sectional view illustrating an example of the structure of a light receiving element according to a fourth embodiment.

FIG. 21 illustrates an example of the structure of a light receiving element 2100 according to a fourth embodiment. FIG. 21 illustrates a cross-section corresponding to the cross-section of the light receiving element 600 according to the first embodiment illustrated as FIG. 7. The light receiving element 2100 illustrated as FIG. 21 differs from the light receiving element 1900 illustrated as FIG. 19 in that a buffer layer is formed between a substrate and a core, but is otherwise the same. A perspective view of the light receiving element 2100 is not illustrated as in the case of the light receiving element 1900 illustrated as FIG. 19.

As illustrated as FIG. 21, the light receiving element 2100 includes a photo-detector unit 2101 provided over a substrate 2114, and a waveguide unit 2111 provided over the same substrate 2114.

The waveguide unit 2111 has a structure in which a buffer layer 2115, a core 2112, and an upper clad layer 2113 are laminated from the substrate 2114 side. The material of each of the layers of this laminate structure is, for example, a semiconductor. The waveguide unit 2111 has a mesa structure including the buffer layer 2115, the upper clad layer 2113, and the core 2112. A signal light propagates in the core 2112, and enter the photo-detector unit 2101.

As for the reason why the buffer layer 2115 is provided between the substrate 2114 and the core 2112, if the core 2112 is formed directly on the surface of the substrate 2114, a situation can arise where when depositing a film that becomes the core 2112 on the surface of the substrate 2114, a defect occurs within the film, making it difficult to obtain a sufficient film quality for the core 2112. The buffer layer 2115 is provided to avoid such a situation.

As illustrated as FIG. 21, for reasons related to the manufacturing process, the buffer layer 2115 remains also in the side wall portion of the photo-detector unit 2101. That is, the buffer 2115 is inserted also between an n-type semiconductor layer 2102 and an i-type absorbing layer 2103. Generally, the buffer layer 2115 is formed of a material that has a low refractive index in comparison to the core 2112. Consequently, as the signal light having propagated through the core 2112 enters the n-type semiconductor layer 2102 and the i-type absorbing layer 2103, loss of the signal light occurs in the buffer layer 2115. To reduce this loss, it is preferable to form the buffer layer 2115 as thin as possible.

The photo-detector unit 2101 has a structure in which the n-type semiconductor layer 2102, the i-type absorbing layer 2103, a p-type upper clad layer 2104, and a p-type contact layer 2105 are laminated from the substrate 2114 side. The material of each of the layers of this laminate structure is, for example, a semiconductor. The photo-detector unit 2101 has a mesa structure including the p-type contact layer 2105, the p-type upper clad layer 2104, the i-type absorbing layer 2103, and part of the n-type semiconductor layer 2102. The n-type semiconductor layer 2102, the i-type absorbing layer 2103, and the p-type upper clad layer 2104 form a PIN-type photodiode.

The core 2112 is connected to a side face of the n-type semiconductor layer 2102 and a side face of the i-type absorbing layer 2103 via the buffer layer 2115. The core 2112, and the n-type semiconductor layer 2102 and the i-type absorbing layer 2103 are connected adjacent to each other via the buffer layer 2115 along the direction in which the core 2112 extends. The core 2112 is so formed that its top face is located higher than the bottom face of the n-type semiconductor layer 2102 (located farther away from the substrate 2114), and its bottom face is located lower than the top face of the n-type semiconductor layer 2102 (located closer to the substrate 2114).

In this specification, cases where the core is connected to a side face of the n-type semiconductor layer or a side face of the i-type absorbing layer also include cases where the core is connected to a side face of the n-type semiconductor layer or a side face of the i-type absorbing layer via the buffer layer.

The n-type semiconductor layer 2102 is so formed that its refractive index is higher than the refractive index of the core 2112, and lower than the refractive index of the i-type absorbing layer 2103. That is, the n-type semiconductor layer 2102 is so formed that its bandgap wavelength is longer than the bandgap wavelength of the core 2112, and shorter than the bandgap wavelength of the i-type absorbing layer 2103. The n-type semiconductor layer 2102 is formed so as to have a composition that makes the absorption coefficient for the signal light sufficiently small.

Further, as illustrated as FIG. 21, the core 2112 is so formed that its top face is located higher than the top face of the n-type semiconductor layer 2102 (located farther away from the substrate 2114), and lower than the top face of the i-type absorbing layer 2103 (located closer to the substrate 2114). The bottom face of the core 2112 is higher than the bottom face of the n-type semiconductor layer 2102 (located farther away from the substrate 2114), and lower than the top face of the n-type semiconductor layer 2102 (located closer to the substrate 2114). The bottom face of the buffer layer 2115 is flush with the bottom face of the n-type semiconductor layer 2102. The structure illustrated as FIG. 21 can be formed by, for example, making the thickness of the laminate including the core 2112 and the buffer layer 2115 larger than the thickness of the n-type semiconductor layer 2102.

However, it is preferable that the thickness of the n-type semiconductor layer 2102 be not less than half the thickness of the core 2112. That is, it is preferable that the thickness of the portion of the core 2112 connected to the i-type absorbing layer 2103 be not more than half the entire thickness of the core 2112. This is to ensure that light absorption in the photo-detector unit 2101 is performed predominantly by seeping out of the signal light from the n-type semiconductor layer 2102 into the i-type absorbing layer 2103, rather than by direct entry of the signal light into the i-type absorbing layer 2103, so that the value of photocarrier density near the end of the photo-detector unit 2101 does not become excessively large. Details in this regard are as described above with reference to the third embodiment.

As illustrated as FIG. 21, in the light receiving element 2100, the signal light propagates in the core 2112 in the waveguide unit 2111, and in the photo-detector unit 2101, the majority of the signal light enters the n-type semiconductor layer 2102, and the remainder of the signal light directly enters the i-type absorbing layer 2103. The n-type semiconductor layer 2102 and the i-type absorbing layer 2103 receive the signal light from the core 2112 along the direction in which the core 2112 extends. Part of the signal light having entered the n-type semiconductor layer 2102 seeps out from the n-type semiconductor layer 2102 into the i-type absorbing layer 2103, and is absorbed in the i-type absorbing layer 2103. The signal light having directly entered the i-type absorbing layer 2103 is absorbed as it is in the region near the end of the i-type absorbing layer 2103 through which the signal light enters.

In the photo-detector unit 2101, as in the photo-detector unit 1901 of the light receiving element 1900 illustrated as FIG. 19, majority of the signal light enters the n-type semiconductor layer 2102 which is directly in contact with the i-type absorbing layer 2103 in which absorption of the signal light takes place. Consequently, in the photo-detector unit 2101, as soon as the majority of the signal light enters the n-type semiconductor layer 2102, the signal light seeps out into the i-type absorbing layer 2103, and absorption of the signal light begins immediately after the entry. Consequently, in the photo-detector unit 2101, the PD length can be made shorter than the PD length of the photo-detector unit 101 in the light receiving element 100 while ensuring sufficient light absorption efficiency.

Because the PD length of the photo-detector unit 2101 can be shortened, capacitance of the photo-detector unit 2101 can be reduced. Consequently, the light receiving element 2100 can supply a detection signal with sufficient signal level to the subsequent electrical circuit also at high frequencies. This makes it possible for the subsequent electrical circuit to process an input signal also at high frequencies.

In addition, in the light receiving element 2100, as in the photo-detector unit 1901 of the light receiving element 1900, part of the signal light directly enters the i-type absorbing layer 2103. Since absorption of the incident signal light takes place in the region near the end of the i-type absorbing layer 2103 from which the signal light enters, the value of photocarrier density near the end of the photo-detector unit 2101 can be increased. Thus, in the light receiving element 2100, the efficiency of light absorption in the photo-detector unit 2101 can be further improved as compared with the photo-detector unit 601 in the light receiving element 600 illustrated as FIG. 7. Accordingly, as compared with the light receiving element 600, the light receiving element 2100 can be also adapted to input of a signal light with lower intensity without increasing the PD length.

Also, in the light receiving element 2100, the further improvement in light absorption efficiency makes it possible to further shorten the PD length of the photo-detector unit 2101 as compared with the light receiving element 600. Further shortening of the PD length enables a further reduction in capacitance of the photo-detector unit 2101. Consequently, the light receiving element 2100 can supply a detection signal with sufficient signal level to the subsequent electrical circuit also at further higher frequencies. This makes it possible for the subsequent electrical circuit to process an input signal also at high frequencies.

On the other hand, in the light receiving element 2100, unlike in the photo-detector unit 301 of the light receiving element 300 illustrated as FIG. 4, only part of the signal light directly enters the i-type absorbing layer 2103. Consequently, the value of photocarrier density does not become excessively large near the end of the photo-detector unit 2101 from which the signal light enters. Consequently, in the photo-detector unit 2101, an excessive increase in local photocarrier density can be reduced even in the case of high intensity light input where the intensity of the inputted signal light is high. Thus, in the light receiving element 2100, it is possible to reduce deterioration of high frequency property for high intensity signal light.

As has been described above, in the light receiving element 2100 according to the fourth embodiment, as in the case of the light receiving element 1900 according to the third embodiment, a detection signal with sufficient signal level can be supplied to the subsequent electrical circuit also at high frequencies while improving the efficiency of light absorption in the photo-detector unit 2101. Further, the light receiving element 2100 can perform an output operation adapted to high intensity light input in which the intensity of the input signal light is high.

Further, in the light receiving element 2100 according to the fourth embodiment, the efficiency of light absorption can be further improved as compared with the light receiving element 600 according to the first embodiment. Thus, the light receiving element 2100 can be also adapted to detection of a signal light with lower intensity without increasing the PD length. Also, the light receiving element 2100 can supply a detection signal with sufficient signal level to the subsequent electrical circuit also at further higher frequencies.

As a specific example of the structure of the light receiving element 2100 according to the fourth embodiment, as in the case of the light receiving element 1900 according to the third embodiment, the configuration described above as a specific example of the structure of the light receiving element 600 according to the first embodiment can be used. However, as the buffer layer 2115, for example, an InP layer with a thickness of 0.1 μm is formed. In addition, the laminate made up of the core 2112 and the buffer layer 2115 is so formed that its thickness is larger than the thickness of the n-type semiconductor layer 2102.

As for the manufacturing method of the light receiving element 2100 as well, as in the case of the light receiving element 1900 according to the third embodiment, the method described above as the manufacturing method of the light receiving element 600 can be used. However, a step of depositing an InP film at a thickness of 0.1 μm is added after the removing step illustrated as FIGS. 14A and 14B, and before the depositing step illustrated as FIGS. 15A and 15B.

[5. Fifth Embodiment]

Figure 22:
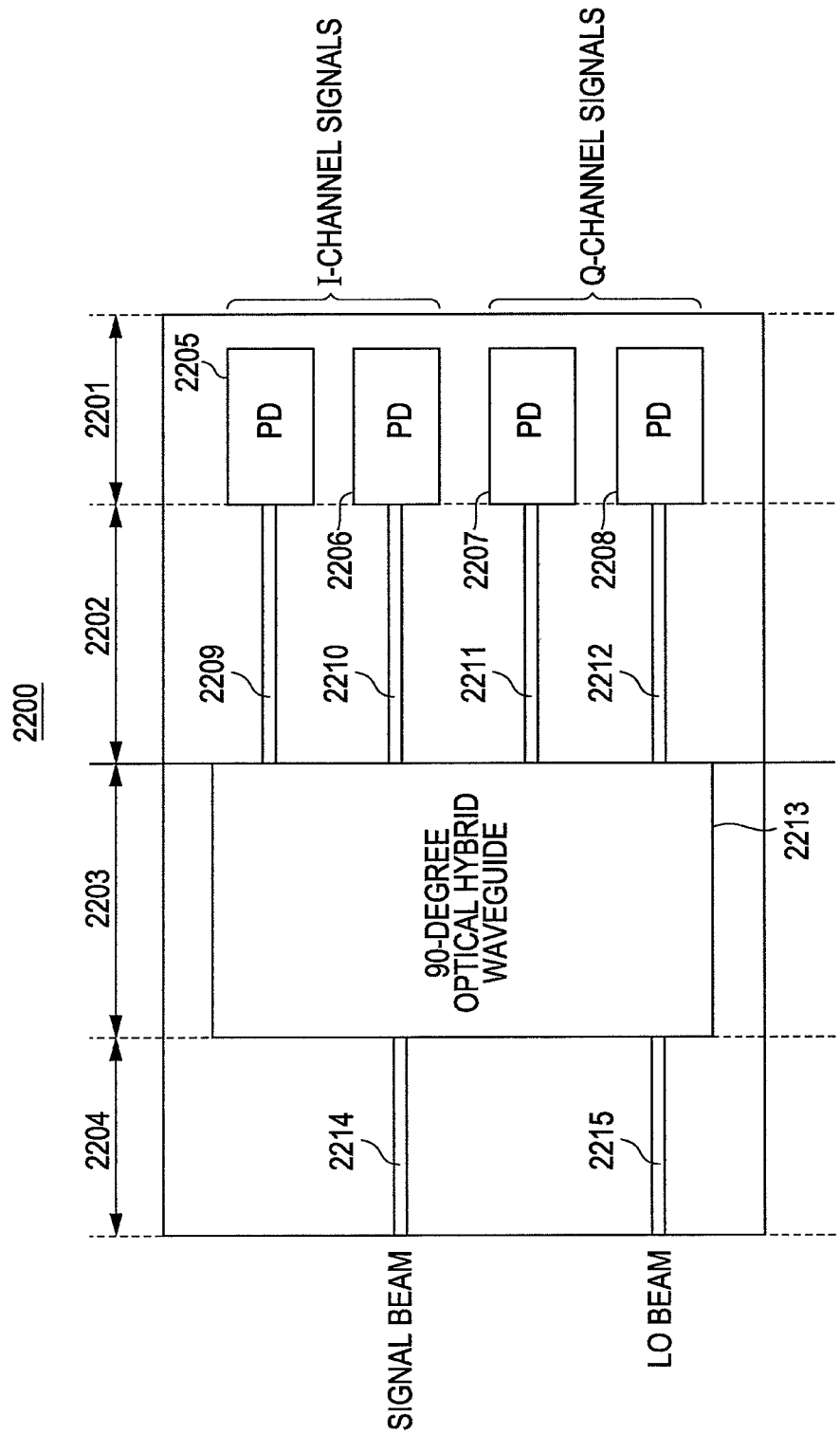
FIG. 22 is a plan view illustrating an example of the configuration of a light receiving device according to a fifth embodiment.

FIG. 22 illustrates an example of the configuration of a light receiving device 2200 according to a fifth embodiment.

The light receiving device 2200 illustrated as FIG. 22 represents an example of optical coherent receiver for demodulating a signal modulated in qaudrature phase shift keying (QPSK) method. The light receiving device 2200 is promising from the viewpoints of miniaturization and assembly cost reduction as a waveguide-integrated type light receiving device in which an optical hybrid waveguide that converts phase-modulated signal lights into intensity-modulated signal lights, and photodiodes (PDs) are integrated over the same substrate.

As illustrated as FIG. 22, the light receiving device 2200 includes a photo-detector unit 2201, a connecting waveguide unit 2202, an optical hybrid waveguide unit 2203, and an input waveguide unit 2204. The photo-detector unit 2201 includes four photodiode (PD) devices 2205 to 2208. The connecting waveguide unit 2202 includes four connecting waveguides 2209 to 2212. The optical hybrid waveguide unit 2203 includes a 90-degree optical hybrid waveguide 2213 having two inputs and four outputs. The input waveguide unit 2203 includes two input waveguides 2214 and 2215.

The two input waveguides 2214 and 2215 of the input waveguide unit 2203 are connected to the two inputs of the 90-degree optical hybrid waveguide 2213. The four connecting waveguides 2209 to 2212 of the connecting waveguide unit 2202 are connected to the four outputs of the 90-degree optical hybrid waveguide 2213. The four connecting waveguides 2209 and 2212 are also connected to the corresponding PD devices 2205 to 2208 of the photo-detector unit 2201.

In the light receiving device 2200, in the portions of the PD device 2205 and the connecting waveguide 2209, the photo-detector unit 601, 1801, 1901, or 2101 and the waveguide unit 611, 1811, 1911, or 2111 in either one of the light receiving elements 600, 1800, 1900, and 2100 according to the first to fourth embodiments illustrated as FIGS. 7, 18, 19, and 21 can be used, respectively. The same applies to the portions of the remaining PD devices and connecting waveguides, namely the PD device 2206 and the connecting waveguide 2212, the PD device 2207 and the connecting waveguide 2210, and the PD device 2208 and the connecting waveguide 2211. The optical hybrid waveguide unit 2203 and the input waveguide unit 2204 have the same layered structure as the connecting waveguide unit 2202, and are formed over the same substrate as the photo-detector unit 2201 and the connecting waveguide unit 2202.

Operation of the light receiving device 2200 is described. A QPSK modulated signal light enters the input waveguide 2214, and a local oscillator (hereinafter referred to as LO) light enters the input waveguide 2215 as a reference light. The 90-degree optical hybrid waveguide 2213 receives the signal light and the LO light via the input waveguides 2214 and 2215, respectively. The 90-degree optical hybrid waveguide 2213 demodulates the QPSK modulated signal light by causing interference between the LO light and the signal light, thereby generating I-channel signal lights that are 180° out of phase with each other and Q-channel signal lights that are 180° out of phase with each other. The 90-degree optical hybrid waveguide 2213 outputs complementary I-channel signal lights to the connecting waveguides 2209 and 2210, and outputs complementary Q-channel signal lights to the connecting waveguides 2211 and 2212.

The PD devices 2205 and 2206 receive the complementary I-channel signal lights from the 90-degree optical hybrid waveguide 2213 via the connecting waveguides 2209 and 2210, respectively. The PD devices 2205 and 2206 each detect the received I-channel signal light as an electrical signal, and generates an I-channel signal (electrical signal). The PD devices 2207 and 2208 receive the complementary Q-channel signal lights from the 90-degree optical hybrid waveguide 2213 via the connecting waveguides 2211 and 2212, respectively. The PD devices 2207 and 2208 each detect the received Q-channel signal light as an electrical signal, and generates an Q-channel signal (electrical signal).

As the 90-degree optical hybrid waveguide 2213 described above, for example, a 4×4 multi-mode interference (hereinafter referred to as MMI) waveguide having four inputs and four outputs can be used. In this case, the input waveguides 2214 and 2215 are each connected to two inputs of the 4×4 MMI waveguide. The connecting waveguides 2209 to 2212 are connected to the four outputs of the 4×4 MMI waveguide.

In the light receiving device 2200 according to the fifth embodiment, as in the case of the light receiving elements 600, 1800, 1900, and 2100 according to the first to fourth embodiments, the I-channel signals and the Q-channel signals generated in the photo-detector unit 2201 can be supplied with sufficient signal level to the subsequent electrical circuit also at high frequencies, while improving the efficiency of light absorption in the photo-detector unit 2201.

The light receiving device 2200 can further perform an output operation adapted to high intensity light input in which the intensity of the input signal light is high. Consequently, for example, when demodulating phase-modulated signal lights by converting the signal lights into intensity-modulated signal lights (the complementary I-channel signal lights and the complementary Q-channel signal lights) in the 90-degree optical hybrid waveguide 2213, even if the intensity of the LO light is raised to increase the intensity of the converted signal lights, in the PD devices 2205 to 2208, deterioration of high frequency property for the inputted high intensity signal light can be reduced.

In the four PD devices 2205 to 2208 included in the photo-detector unit 2201, the corresponding n-type semiconductor layers are formed independently. Thus, not only p-side electrodes but also n-side electrodes can be formed so as to be electrically isolated between the individual PD devices 2205 to 2208, thereby ensuring sufficient electrical isolation between the individual PD devices 2205 to 2208. Accordingly, unwanted crosstalk between the PD devices 2205 to 2208 can be reduced, thereby making it possible for the light receiving device 2200 to receive a signal light with little error.

While an optical coherence receiver is given as an example of the light receiving device 2200 of a waveguide-integrated type in the fifth embodiment mentioned above, the fifth embodiment is not limited to this. Any device in which PDs and waveguides are integrated may be used, and the light receiving element 600, 1800, 1900, or 2100 according to each of the first to fourth embodiments can be applied to such a device.

[6. Sixth Embodiment]

Figure 23:
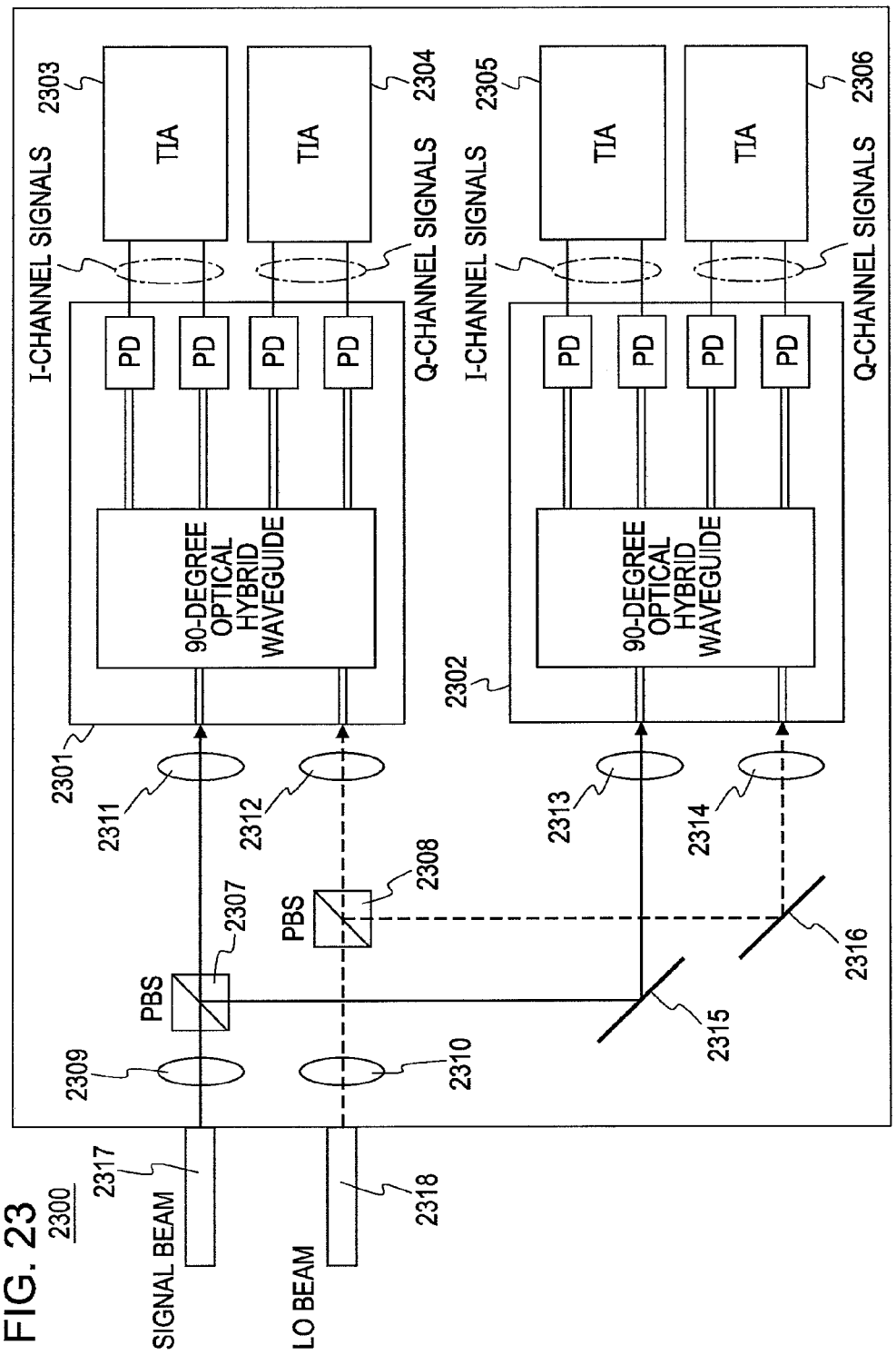
FIG. 23 is a plan view illustrating an example of the configuration of a light receiving module according to a sixth embodiment.

FIG. 23 illustrates an example of the configuration of a light receiving device 2300 according to a sixth embodiment.

A light receiving module 2300 illustrated as FIG. 23 represents an example of optical coherent receiver module for demodulating a signal modulated in dual polarization-quadrature phase shift keying (DP-QPSK) method.

As illustrated as FIG. 23, the light receiving module 2300 includes optical coherent receivers 2301 and 2302, trans-impedance amplifiers (hereinafter referred to as TIA) 2303 to 2306, polarization light splitters (hereinafter referred to as PBS) 2307 and 2308, lenses 2309 to 2314, and mirrors 2315 and 2316. Also, optical fiber cables 2317 and 2318 are connected to the light receiving module 2300.

The light receiving module 2300 receives a DP-QPSK modulated signal light via the optical fiber cable 2317, and receives an LO light as a reference light via the optical fiber cable 2318. The DP-QPSK modulated signal includes two signal lights having different, mutually orthogonal polarization directions, and the two signal lights transmit signals that are different from each other.

The DP-QPSK modulated signal light is made to enter the PBS 2307 via the lens 2309, and split by the PBS 2307 into two signal lights having different polarization directions. One of the split two signal lights is made to enter the optical coherent receiver 2301 via the lens 2311, and the other is made to enter the optical coherent receiver 2302 via the mirror 2315 and the lens 2313. The LO light is similarly supplied to each of the optical coherent receivers 2301 and 2302.

As each of the optical coherent receivers 2301 and 2302, the light receiving device 2200 according to the fifth embodiment illustrated as FIG. 22 can be used. The optical coherent receivers 2301 and 2302 each receive the QPSK modulated signal light and the LO light, and demodulates the QPSK modulated signal by causing interference between the LO light and the signal light.

The optical coherent receiver 2301 detects complimentary I-channel signal lights obtained by the demodulation as complimentary electrical signals (I-channel signals). The optical coherent receiver 2301 detects complimentary Q-channel signal lights obtained by the demodulation as complimentary electrical signals (Q-channel signals). The optical coherent receiver 2301 supplies the complementary I-channel signals (electrical signals) obtained by the detection to the TIA 2303, and supplies the complementary Q-channel signals (electrical signals) obtained by the detection to the TIA 2304. Likewise, the optical coherent receiver 2302 supplies complementary I-channel signals to the TIA 2305, and supplies complementary Q-channel signals to the TIA 2306.

The TIAs 2303 to 2306 each receive the complementary I-channel signals or the complementary Q-channel signals, and differentially amplifies the signal level.

In the light receiving module 2300 according to the sixth embodiment, as in the light receiving device 2200 according to the fifth embodiment, it is possible to supply I-channel signals and Q-channel signals with sufficient signal level to each of the TIAs 2303 to 2306 also at high frequencies, while improving the efficiency of light absorption in the optical coherent receivers 2301 and 2302.

Further, the light receiving module 2300 can perform an output operation adapted to high intensity light input in which the intensity of the input signal light is high. Consequently, for example, when demodulating phase-modulated signal lights by converting the signal lights into intensity-modulated signal lights in each of the optical coherent receivers 2301 and 2302, even if the intensity of the LO light is raised to increase the intensity of the converted signal lights, deterioration of high frequency property for the inputted high intensity signal light can be reduced.

In the plurality of PD devices included in each of the optical coherent receivers 2301 and 2302, the corresponding n-type semiconductor layers are formed independently. Thus, not only p-side electrodes but also n-side electrodes can be formed so as to be electrically isolated between the individual PD devices, thereby ensuring sufficient electrical isolation between the individual PD devices. Accordingly, unwanted crosstalk between the PD devices can be reduced, thereby making it possible for the light receiving module 2300 to receive a signal light with little error.

The light receiving element, the light receiving device, and the light receiving module according to each of the illustrative embodiments have been described above. However, the embodiments are not limited to the embodiments specifically discussed herein, and various changes and modifications could be made to the embodiments without departing from the scope of the appended claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A light receiving element comprising:
   a first region including a wave core layer configured to propagate a signal light;
   a second region including:
      a first semiconductor layer having a first conductivity type, the first semiconductor layer being configured to receive the signal light from the wave core layer along a first direction, the wave core layer extending in the first direction;
      an absorbing layer configured to absorb the signal light received by the first semiconductor layer; and
      a second semiconductor layer having a second conductivity type opposite to the first conductivity type.

2. The light receiving element of claim 1,
   wherein the wave core layer and the first semiconductor layer are connected adjacent to each other along the first direction.

3. The light receiving element of claim 1,
   wherein an upper face of the wave core layer is located farther away from a substrate than a lower face of the first semiconductor layer, and a lower face of the wave core layer is located closer to the substrate than an upper face of the first semiconductor layer, the wave core layer and the first semiconductor layer being disposed on or above the substrate.

4. The light receiving element of claim 1,
   wherein a refractive index of the absorbing layer is higher than a refractive index of the first semiconductor layer.

5. The light receiving element of claim 1,
   wherein a refractive index of the first semiconductor layer is higher than a refractive index of the wave core layer.

6. The light receiving element of claim 1,
   wherein an upper face of the wave core layer is located closer to a substrate than an upper face of the first semiconductor layer, the wave core layer and the first semiconductor layer being disposed on or above the substrate.

7. The light receiving element of claim 6,
   wherein a thickness of the wave core layer is smaller than a thickness of the first semiconductor layer.

8. The light receiving element of claim 1,
   wherein an upper face of the wave core layer is located farther away from a substrate than an upper face of the first semiconductor layer, and is located closer to the substrate than an upper face of the absorbing layer, the wave core layer and the first semiconductor layer being disposed on or above the substrate.

9. The light receiving element of claim 8,
   wherein a thickness of the first semiconductor layer is not less than half of a thickness of the wave core layer.

10. The light receiving element of claim 1 wherein a lower face of the wave core layer is located farther away from a substrate than a lower face of the first semiconductor layer, and is located closer to the substrate than an upper face of the first semiconductor layer, the wave core layer and the first semiconductor layer being disposed on or above the substrate.

11. The light receiving element of claim 10, further comprising a buffer layer disposed between the wave core layer and the substrate.

12. The light receiving element of claim 10,
   wherein a thickness of the first semiconductor layer is not less than half of a thickness of the wave core layer.

13. The light receiving element of claim 1,
   wherein the first semiconductor layer, the absorbing layer, and the second semiconductor layer form a PIN-type photodiode.

14. The light receiving element of claims 1,
   wherein the wave core layer and the first semiconductor layer are provided on or above the same substrate.

15. The light receiving element of claim 1, further comprising a third semiconductor layer formed on the wave core layer.

* * * * *